(12) United States Patent
Liu

(10) Patent No.: US 10,917,589 B2
(45) Date of Patent: Feb. 9, 2021

(54) DIGITAL PIXEL WITH EXTENDED DYNAMIC RANGE

(71) Applicant: Facebook Technologies, LLC, Menlo Park, CA (US)

(72) Inventor: Xinqiao Liu, Medina, WA (US)

(73) Assignee: Facebook Technologies, LLC, Menlo Park, CA (US)

( * ) Notice: Subject to any disclaimer, the term of this patent is extended or adjusted under 35 U.S.C. 154(b) by 300 days.

(21) Appl. No.: 15/719,345

(22) Filed: Sep. 28, 2017

(65) Prior Publication Data

US 2018/0376082 A1 Dec. 27, 2018

Related U.S. Application Data

(60) Provisional application No. 62/525,045, filed on Jun. 26, 2017.

(51) Int. Cl.
*H04N 5/353* (2011.01)
*H01L 27/146* (2006.01)
(Continued)

(52) U.S. Cl.
CPC ............ *H04N 5/353* (2013.01); *G01J 1/4228* (2013.01); *G01J 1/44* (2013.01); *H01L 27/1461* (2013.01);
(Continued)

(58) Field of Classification Search
CPC ........... H01L 27/14636; H01L 27/1464; H01L 27/1461; H01L 27/1465; H04N 5/353;
(Continued)

(56) References Cited

U.S. PATENT DOCUMENTS 4,596,977 A 6/1986 Bauman et al.
5,053,771 A 10/1991 McDermott
(Continued)

FOREIGN PATENT DOCUMENTS

EP 0675345 A2 10/1995
EP 1681856 A2 7/2006
(Continued)

OTHER PUBLICATIONS

U.S. Appl. No. 15/801,216, "Non-Final Office Action", dated Jun. 27, 2019, 13 pages.
(Continued)

*Primary Examiner* — Jennifer D Bennett
(74) *Attorney, Agent, or Firm* — Kilpatrick Townsend & Stockton LLP

(57) ABSTRACT

Examples of a pixel cell are disclosed. In one example, a pixel cell may include a first semiconductor layer including a photodiode and one or more transistor devices configured to convert charges generated by the photodiode into an analog signal. The pixel cell may also include a second semiconductor layer including one or more transistor devices configured to convert the analog signal to one or more digital signals. The first semiconductor layer and the second semiconductor layer may form a stack structure. In another example, a pixel cell may include a photodiode and a capacitor. The pixel cell may be operated, in a first mode of measurement, to measure the charges stored at the capacitor when the capacitor is electrically coupled with the photodiode, and in a second mode of measurement, to measure the charges stored at the capacitor when the capacitor is electrically isolated from the photodiode.

13 Claims, 14 Drawing Sheets

(51) Int. Cl.
| | |
|---|---|
| *H04N 5/378* | (2011.01) |
| *H04N 5/355* | (2011.01) |
| *G01J 1/42* | (2006.01) |
| *G01J 1/44* | (2006.01) |
| *H04N 5/369* | (2011.01) |
| *H04N 5/3745* | (2011.01) |

(52) U.S. Cl.
CPC ...... *H01L 27/1464* (2013.01); *H01L 27/1465* (2013.01); *H01L 27/14636* (2013.01); *H04N 5/3559* (2013.01); *H04N 5/35527* (2013.01); *H04N 5/378* (2013.01); *H04N 5/379* (2018.08); *H04N 5/37455* (2013.01); *G01J 2001/446* (2013.01); *G01J 2001/448* (2013.01)

(58) Field of Classification Search
CPC ............... H04N 5/35527; H04N 5/379; H04N 5/37455; H04N 5/3559; H04N 5/378; G01J 1/44; G01J 1/4228; G01J 2001/448; G01J 2001/446
See application file for complete search history.

(56) References Cited

U.S. PATENT DOCUMENTS

| | | | |
|---|---|---|---|
| 7,719,589 B2* | 5/2010 | Turchetta | H04N 5/3742 348/308 |
| 8,134,623 B2 | 3/2012 | Purcell et al. | |
| 8,144,227 B2 | 3/2012 | Kobayashi | |
| 8,426,793 B1* | 4/2013 | Barrows | H04N 5/359 250/208.1 |
| 8,754,798 B2 | 6/2014 | Lin | |
| 8,773,562 B1 | 7/2014 | Fan | |
| 8,779,346 B2 | 7/2014 | Fowler et al. | |
| 8,946,610 B2 | 2/2015 | Iwabuchi et al. | |
| 9,094,629 B2 | 7/2015 | Ishibashi | |
| 9,332,200 B1 | 5/2016 | Hseih et al. | |
| 9,343,497 B2 | 5/2016 | Cho | |
| 9,363,454 B2 | 6/2016 | Ito et al. | |
| 9,478,579 B2 | 10/2016 | Dai et al. | |
| 9,497,396 B2 | 11/2016 | Choi | |
| 9,800,260 B1 | 10/2017 | Banerjee | |
| 9,967,496 B2 | 5/2018 | Ayers et al. | |
| 10,003,759 B2 | 6/2018 | Fan | |
| 10,419,701 B2 | 9/2019 | Liu | |
| 10,598,546 B2 | 3/2020 | Liu | |
| 10,686,996 B2 | 6/2020 | Liu | |
| 2002/0067303 A1 | 6/2002 | Lee et al. | |
| 2003/0020100 A1 | 1/2003 | Guidash | |
| 2003/0049925 A1 | 3/2003 | Layman et al. | |
| 2004/0095495 A1 | 5/2004 | Inokuma et al. | |
| 2005/0057389 A1 | 3/2005 | Krymski | |
| 2005/0104983 A1 | 5/2005 | Raynor | |
| 2006/0023109 A1 | 2/2006 | Mabuchi et al. | |
| 2007/0076481 A1 | 4/2007 | Tennant | |
| 2007/0102740 A1 | 5/2007 | Ellis-Monaghan et al. | |
| 2007/0131991 A1* | 6/2007 | Sugawa | H01L 27/14609 257/292 |
| 2007/0222881 A1 | 9/2007 | Mentzer | |
| 2008/0001065 A1 | 1/2008 | Ackland | |
| 2008/0088014 A1 | 4/2008 | Adkisson et al. | |
| 2008/0226183 A1 | 9/2008 | Lei et al. | |
| 2009/0261235 A1* | 10/2009 | Lahav | H04N 5/37455 250/208.1 |
| 2010/0140732 A1 | 6/2010 | Eminoglu et al. | |
| 2010/0276572 A1 | 11/2010 | Iwabuchi et al. | |
| 2011/0049589 A1 | 3/2011 | Chuang et al. | |
| 2011/0254986 A1 | 10/2011 | Nishimura et al. | |
| 2012/0068051 A1 | 3/2012 | Ahn et al. | |
| 2012/0133807 A1 | 5/2012 | Wu et al. | |
| 2012/0262616 A1 | 10/2012 | Sa et al. | |
| 2012/0273654 A1 | 11/2012 | Hynecek et al. | |
| 2013/0020466 A1 | 1/2013 | Ayers et al. | |
| 2013/0056809 A1 | 3/2013 | Mao et al. | |
| 2013/0057742 A1 | 3/2013 | Nakamura et al. | |
| 2013/0082313 A1 | 4/2013 | Manabe | |
| 2013/0126710 A1 | 5/2013 | Kondo | |
| 2013/0141619 A1 | 6/2013 | Lim et al. | |
| 2013/0207219 A1 | 8/2013 | Ahn | |
| 2013/0214371 A1 | 8/2013 | Asatsuma et al. | |
| 2013/0299674 A1 | 11/2013 | Fowler et al. | |
| 2014/0021574 A1 | 1/2014 | Egawa | |
| 2014/0042299 A1 | 2/2014 | Wan et al. | |
| 2014/0042582 A1 | 2/2014 | Kondo | |
| 2014/0085523 A1 | 3/2014 | Hynecek | |
| 2014/0176770 A1 | 6/2014 | Kondo | |
| 2014/0232890 A1 | 8/2014 | Yoo et al. | |
| 2015/0090863 A1 | 4/2015 | Mansoorian et al. | |
| 2015/0172574 A1 | 6/2015 | Honda et al. | |
| 2015/0189209 A1 | 7/2015 | Yang et al. | |
| 2015/0229859 A1 | 8/2015 | Guidash et al. | |
| 2015/0279884 A1 | 10/2015 | Kusumoto | |
| 2015/0312502 A1 | 10/2015 | Borremans | |
| 2016/0028974 A1 | 1/2016 | Guidash et al. | |
| 2016/0028980 A1 | 1/2016 | Kameyama et al. | |
| 2016/0037111 A1 | 2/2016 | Dai et al. | |
| 2016/0088253 A1 | 3/2016 | Tezuka | |
| 2016/0100115 A1 | 4/2016 | Kusano | |
| 2016/0111457 A1 | 4/2016 | Sekine | |
| 2016/0112626 A1 | 4/2016 | Shimada | |
| 2016/0118992 A1 | 4/2016 | Milkov | |
| 2016/0165160 A1 | 6/2016 | Hseih et al. | |
| 2016/0204150 A1 | 7/2016 | Oh et al. | |
| 2016/0337605 A1 | 11/2016 | Ito | |
| 2016/0360127 A1 | 12/2016 | Dierickx et al. | |
| 2017/0053962 A1 | 2/2017 | Oh et al. | |
| 2017/0062501 A1 | 3/2017 | Velichko et al. | |
| 2017/0099446 A1 | 4/2017 | Cremers et al. | |
| 2017/0104021 A1 | 4/2017 | Park et al. | |
| 2017/0104946 A1 | 4/2017 | Hong | |
| 2017/0111600 A1 | 4/2017 | Wang et al. | |
| 2017/0141147 A1* | 5/2017 | Raynor | H01L 27/14609 |
| 2017/0170223 A1 | 6/2017 | Hynecek et al. | |
| 2017/0346579 A1 | 11/2017 | Barghi | |
| 2018/0220093 A1* | 8/2018 | Murao | H01L 27/14605 |
| 2018/0376046 A1 | 12/2018 | Liu | |
| 2019/0052788 A1 | 2/2019 | Liu | |
| 2019/0056264 A1 | 2/2019 | Liu | |
| 2019/0057995 A1 | 2/2019 | Liu | |
| 2019/0058058 A1 | 2/2019 | Liu | |
| 2019/0157330 A1 | 5/2019 | Sato et al. | |
| 2019/0355782 A1 | 11/2019 | Do et al. | |
| 2019/0379827 A1 | 12/2019 | Berkovich et al. | |
| 2020/0007800 A1 | 1/2020 | Berkovich et al. | |
| 2020/0068189 A1 | 2/2020 | Chen et al. | |

FOREIGN PATENT DOCUMENTS

| | | |
|---|---|---|
| EP | 1732134 A1 | 12/2006 |
| EP | 1746820 A1 | 1/2007 |
| EP | 3258683 A1 | 12/2017 |
| KR | 100574959 B1 | 4/2006 |
| KR | 20150095841 A | 8/2015 |
| KR | 20160008287 A | 1/2016 |
| WO | 2017058488 A1 | 4/2017 |
| WO | 2017169882 A1 | 10/2017 |

OTHER PUBLICATIONS

U.S. Appl. No. 15/847,517, "Non-Final Office Action", dated Nov. 23, 2018, 21 pages.
U.S. Appl. No. 15/847,517, "Notice of Allowance", dated May 1, 2019, 11 pages.
U.S. Appl. No. 16/566,583, "Non-Final Office Action", dated Oct. 1, 2019, 10 pages.
EP18179838.0, "Extended European Search Report", dated May 24, 2019, 17 pages.
EP18179851.3, "Extended European Search Report", dated Dec. 7, 2018, 8 pages.
EP18188962.7, "Extended European Search Report", dated Oct. 23, 2018, 8 pages.

(56) References Cited

OTHER PUBLICATIONS

EP18188962.7, "Office Action", dated Aug. 28, 2019, 6 pages.
Kavusi, et al., "Quantitative Study of High-Dynamic-Range Image Sensor Architectures", Proceedings of SPIE, The International Society for Optical Engineering, vol. 5301, XP055186908, Jun. 7, 2004, pp. 264-275.
PCT/US2018/039431, "International Search Report and Written Opinion", dated Nov. 7, 2018, 14 pages.
PCT/US2018/045673, "International Search Report and Written Opinion", dated Dec. 4, 2018, 13 pages.
International Application No. PCT/US2018/039350, "International Search Report and Written Opinion", dated Nov. 15, 2018, 13 pages.
International Application No. PCT/US2018/039352, "International Search Report and Written Opinion Received", dated Oct. 26, 2018, 10 pages.
Cho, et al., "A Low Power Dual CDS for a Column-Parallel CMOS Image Sensor", Journal of Semiconductor Technology and Science, vol. 12, No. 4, Dec. 30, 2012, pp. 388-396.
European Application No. EP18179838.0, "Partial European Search Report", dated Dec. 5, 2018, 14 pages.
European Application No. EP18179846.3, "Extended European Search Report", dated Dec. 7, 2018, 10 pages.
U.S. Appl. No. 15/876,061, "Non-Final Office Action", dated Sep. 18, 2019, 23 pages.
PCT/US2018/064181, "International Search Report and Written Opinion", dated Mar. 29, 2019, 12 pages.
PCT/US2019/014044, "International Search Report and Written Opinion", dated May 8, 2019, 11 pages.
U.S. Appl. No. 15/876,061, "Notice of Allowance", dated Feb. 4, 2020, 13 pages.
U.S. Appl. No. 16/566,583, "Final Office Action", dated Apr. 15, 2020, 24 pages.
U.S. Appl. No. 15/876,061, "Corrected Notice of Allowability", dated Apr. 28, 2020, 3 pages.
U.S. Appl. No. 15/983,379, "Notice of Allowance", dated Oct. 18, 2019, 9 pages.
U.S. Appl. No. 16/382,015, "Notice of Allowance", dated Jun. 11, 2020, 11 pages.
U.S. Appl. No. 16/431,693, "Non-Final Office Action", dated Jan. 30, 2020, 6 pages.
U.S. Appl. No. 16/431,693, "Notice of Allowance", dated Jun. 24, 2020, 7 pages.
U.S. Appl. No. 16/454,787, "Notice of Allowance", dated Apr. 22, 2020, 10 pages.
U.S. Appl. No. 16/454,787, "Notice of Allowance", dated Jul. 9, 2020, 9 pages.
EP18189100.3, "Extended European Search Report", dated Oct. 9, 2018, 8 pages.
PCT/US2018/046131, "International Search Report and Written Opinion", dated Dec. 3, 2018, 10 pages.
PCT/US2019/035724, "International Search Report and Written Opinion", dated Sep. 10, 2019, 12 pages.
PCT/US2019/036484, "International Search Report and Written Opinion", dated Sep. 19, 2019, 10 pages.
PCT/US2019/036575, "International Search Report and Written Opinion", dated Sep. 30, 2019, 16 pages.
Application No. PCT/US2019/039758, International Search Report and Written Opinion, dated Oct. 11, 2019, 13 pages.
Application No. PCT/US2019/065430, International Search Report and Written Opinion, dated Mar. 6, 2020, 15 pages.
Snoeij, "A Low Power Column-Parallel 12-Bit ADC for CMOS Imagers", Institute of Electrical and Electronics Engineers Workshop on Charge-Coupled Devices and Advanced Image Sensors, Jun. 2005, pp. 169-172.
Xu et al., "A New Digital-Pixel Architecture for CMOS Image Sensor With Pixel-Level ADC and Pulse Width Modulation using a 0.18 Mu M CMOS Technology", IEEE Conference on Electron Devices and Solid-State Circuits, Dec. 16-18, 2003, pp. 265-268.

* cited by examiner

DIGITAL PIXEL WITH EXTENDED DYNAMIC RANGE

RELATED APPLICATIONS

This patent application claims priority to U.S. Provisional Patent Application No. 62/525,045, filed Jun. 26, 2017, entitled "HIGH SPEED, HIGH DYNAMIC RANGE, LOW POWER MACHINE VISION SENSOR DEVELOPMENT," which is assigned to the assignee hereof and is incorporated herein by reference in its entirety for all purposes.

BACKGROUND

The disclosure relates generally to image sensors, and more specifically to pixel cell structure including interfacing circuitries for determining light intensity for image generation.

A typical image sensor includes a photodiode to sense incident light by converting photons into charges (e.g., electrons or holes). The image sensor further includes a floating node configured as a capacitor to collect the charges generated by the photodiode during an exposure period. The collected charges can develop a voltage at the capacitor. The voltage can be buffered and fed to an analog-to-digital converter (ADC), which can convert the voltage into a digital value representing the intensity of the incident light. Conventionally, the capacitor, the buffer, and the ADC may be integrated with the photodiode on the same semiconductor substrate, with the ADC being arranged to be on the same side as the photodiode, to reduce wiring and the associated parasitic capacitance.

The digital value generated by the ADC, which reflects a number of charges stored at the floating node within a certain period, may correlate to the intensity of the incident light. However, the degree of correlation can be affected by different factors. First, the rate of charges generated by the photodiode can be directly related to the intensity of the incident light until the photodiode reaches a saturation limit, beyond which the rate of charges generated may become stagnant, or at least does not increase linearly with the light intensity. Moreover, the charges collected at the floating node also include noise charges not related to the intensity of incident light. One source of noise charges can be dark current, which can be leakage currents generated at the p-n junction of the photodiode and at the p-n junctions of other semiconductor devices connected to the capacitor, due to crystallographic defects. The dark currents can flow into the capacitor and add charges which are not correlated to the intensity of the incident light. Another source of noise charges can be due to capacitive coupling with other circuitries. The noise charges can determine a lower limit of the measurable light intensity, whereas the saturation limit may determine an upper limit of the measureable light intensity of the image sensor. A ratio between the upper limit and the lower limit defines a dynamic range, which may set a range of operational light intensities for the image sensor.

An image can be generated based on intensity data provided by an array of image sensors, with each image sensor forming a pixel cell that corresponds to a pixel of the image. The array of pixel cells can be arranged into rows and columns, with each pixel cell generating a voltage representing the intensity for a pixel associated with a particular location in the image. A number of pixels included in the array can determine a resolution of the generated image. The voltage can be converted into digital intensity data by an ADC, and an image can be reconstructed based on the digital intensity data of each pixel.

Due to the size of ADCs and limited available area, it may be impossible to put a dedicated ADC on the same side as each pixel cell of a pixel array. As a result, some of the pixel cells may have to take turn in accessing the ADCs to generate digital intensity data. For example, a set of ADCs are provided to process, simultaneously, the voltages generated by each pixel cell within one row. But adjacent rows of pixel cells may have to take turn in accessing the set of ADCs. In one example, to generate an image, the pixel array can be operated in a rolling shuttering fashion, in which each pixel row is exposed to incident lights to generate intensity data sequentially. For example, one pixel row of image sensors can be exposed to the incident lights in an exposure period. Each pixel cell within the row can generate a voltage based on the charges generated by the photodiode during the exposure period, and forward the voltage to the ADC. The ADCs can generate a set of digital data representing the intensities of the incident lights received by that pixel row. After the set of digital data is generated for one pixel row, the next pixel row can be exposed to the incident lights in a subsequent exposure period to generate another set of digital intensity data, until all of the pixel rows have been exposed to the incident light and have output intensity data. In yet another example, the exposure time of different rows of pixels can have some overlap, but each row of pixels still needs to take turn in converting the voltages generated from the photodiode charges into digital data. An image can be generated based on the digital intensity data of each pixel row.

Image sensors can be found in many different applications. As an example, image sensors are included in digital imaging devices (e.g., digital cameras, smart phones, etc.) to provide digital imaging. As another example, image sensors can be configured as input devices to control or influence the operation of a device, such as controlling or influencing the display content of a near-eye display in wearable virtual-reality (VR) systems and/or augmented-reality (AR) and/or mixed reality (MR) systems. For example, the image sensors can be used to generate physical image data of a physical environment in which a user is located. The physical image data can be provided to a location tracking system operating a simultaneous localization and mapping (SLAM) algorithm to track, for example, a location of the user, an orientation of the user, and/or a path of movement of the user in the physical environment. The image sensors can also be used to generate physical image data including stereo depth information for measuring a distance between the user and an object in the physical environment. The image sensors can also be configured as a near-infrared (NIR) sensor. An illuminator may project a pattern of NIR light into the eyeballs of the user. The internal structures of the eyeballs (e.g., the pupils) may generate a reflective pattern from the NIR light. The image sensors can capture images of the reflective pattern, and provide the images to a system to track the movement of the eyeballs of the user to determine a gaze point of the user. Based on these physical image data, the VR/AR/MR system may generate and update virtual image data for displaying to the user via the near-eye display, to provide an interactive experience to the user. For example, the VR/AR/MR system may update the virtual image data based the user's gazing direction (which may signal the user's interest in the object), a location of the user, etc.

As discussed above, conventionally, the ADC (and other supporting circuitries) may be arranged to be on the same semiconductor substrate as the photodiode, to reduce wiring and the associated parasitic capacitance. Such approach may not work well for wearable VR/AR/MR systems. First, multiple image sensors may be included at different locations of the VR/AR/MR system, to provide different fields of views of the physical environment, for more accurate location/movement tracking of the user. Due to the limited form-factor of the wearable VR/AR/MR system, each of the image sensors may occupy a very small area. By putting the ADCs on the same side as the photodiodes, the available area for the photodiodes may reduce. The smaller photodiode area reduces the overall light sensitivity of the image sensors, which can be critical for low light environment applications. The smaller photodiode also limits the quantity of photons that can be collected in the photodiode. As a result, under low light intensity the photons collected in the photodiode can be masked by the noise charges, which can lead to reduction in the range of measureable light intensities, as well as a reduction in the dynamic range of the image sensor. Further, since the ADC circuitry typically occupies large portion of total sensor substrate area, a few number of pixel cells can be included in each of the image sensors due to form factor constraint, which reduces the available resolution. Further, in a sensor architecture where multiple pixels (for example, the whole column of them) share an ADC, the processing time for generating the image is increased. The increased processing time also adds delay to the location/eyeball tracking based on the image.

On the other hand, the wearable VR/AR/MR system may operate in environments with a very wide range of light intensities. For example, the wearable VR/AR/MR system may be able to operate in an indoor environment or in an outdoor environment, and/or at different times of the day, and the light intensity of the operation environment of the wearable VR/AR/MR system may vary substantially. Moreover, the wearable VR/AR/MR system may also include the aforementioned NIR eyeball tracking system, which may require projecting lights of very low intensity into the eyeballs of the user to prevent damaging the eyeballs. As a result, the image sensors of the wearable VR/AR/MR system may need to have a wide dynamic range to be able to operate properly (e.g., to generate an output that correlates with the intensity of incident light) across a very wide range of light intensities associated with different operating environments. The image sensors of the wearable VR/AR/MR system may also need to generate images at sufficient high speed to allow tracking of the user's location, orientation, gaze point, etc. Image sensors with relatively limited dynamic ranges and generate images at relatively low speed may not be suitable for such a wearable VR/AR/MR system.

Moreover, it is typically difficult to optimize the semiconductor devices for light sensing (e.g., the photodiode, the transistor device providing the floating node for charge storage, etc.) and the semiconductor devices for the ADC, if the devices share a common semiconductor substrate. This is because the semiconductor devices for light sensing and the ADC typically have very different performance targets, which can lead to conflicting configurations of the common semiconductor substrate. For example, it is desirable to reduce the dark current in the semiconductor devices responsible for light sensing. As discussed above, the dark currents are generated as leakage current at the p-n junctions of these semiconductor devices. One way to reduce the leakage current is to change the doping of the semiconductor substrate, to reduce the mobility of the charge carriers. However, reducing the mobility of the charge carriers may be undesirable for the semiconductor devices of the ADC, as the bandwidth of the semiconductor devices may be reduced, which in turn reduce the throughput of the ADC. Moreover, the optimized semiconductor devices for light sensing may also result in higher power consumption for the ADC operation, which can be a critical performance aspect for a wearable VR/AR/MR system. For lowest power and faster digital function operation, it is advantageous to use the most advanced semiconductor process technology nodes for ADC and other sensor logic functional blocks, but such process technology nodes typically are not optimized for light sensing. As a result, if the light sensing devices and the ADC devices are to share the same semiconductor substrate, as in the conventional approach, it becomes very difficult to optimize both set of devices to assemble an image sensor that provides good light sensing capability, high processing speed, and low power consumption.

Therefore, there is a need to provide an image sensor with larger available area for photodiodes and ADCs to improve resolution, low light sensitivity and processing speed, and with an extended dynamic range. Also there is a need to optimize the light sensing and ADC device independently for both performance improvement and power reduction.

SUMMARY

The present disclosure relates to image sensors. More specifically, and without limitation, this disclosure relates to using a stack structure for forming a pixel cell. This disclosure also relates to operating the circuitries of a pixel cells to measure the intensity of incident lights in two different measurement modes.

In one example, a pixel cell is provided. The pixel cell may comprise a first semiconductor layer including a photodiode and one or more transistor devices configured to convert charges generated by the photodiode into an analog signal, the photodiode occupying a first region in the first semiconductor layer, and a second semiconductor layer including one or more transistor devices configured to convert the analog signal to one or more digital signals, the one or more transistor devices of the second semiconductor layer occupying a second region in the second semiconductor layer. The first semiconductor layer may form a stack structure with the second semiconductor layer along an axis. The first region and the second region overlap at least partially along the axis.

In some aspects, the first semiconductor layer includes a first surface and a second surface. The first semiconductor layer may include one or more first metal interconnects disposed on the second surface. The second semiconductor layer may include a third surface facing the second surface. The second semiconductor layer may include one or more second metal interconnects disposed on the third surface. The pixel cell may further include one or more third metal interconnects to provide electrical connection between the one or more first metal interconnects and the one or more second metal interconnects. The first surface is configured to receive light photons.

In some aspects, the first semiconductor layer includes a different doping profile from the second semiconductor layer. The first semiconductor layer may include a doping gradient to introduce an electric field between a first surface and a second surface of the first semiconductor layer. The first semiconductor layer may also have a different thickness from the second semiconductor layer. The thickness of the first semiconductor can be configured based on a target quantum efficiency for photons associated with a pre-determined frequency.

In some aspects, the one or more transistor devices of the first semiconductor layer comprises a first transistor with a source terminal coupled with the photodiode, a drain terminal configured as a capacitor, and a gate terminal being operable to control a flow of electrons generated by the photodiode to the capacitor. The one or more transistor devices of the second semiconductor layer may comprise a digital-to-analog converter configured to generate the one or more digital signals based on an analog voltage at the drain terminal of the first transistor. The digital-to-analog converter may comprise a counter, a memory, and a voltage comparator. The memory is configured to store one or more count values output by the counter. The voltage comparator may be configured to control the storing of the one or more count values at the memory based on the analog voltage at the drain terminal of the first transistor to generate the one or more digital signals. The gate terminal may be controlled to allow electrons to flow from the photodiode to the capacitor when a quantity of charges stored at the photodiode exceeds a threshold. The one or more transistor devices of the first semiconductor layer may comprise a second transistor configured to, during a reset mode, remove charges stored at the capacitor. The one or more transistor devices of the first semiconductor layer may comprise a second transistor configured to, during a reset mode, remove charges stored at the capacitor and at the photodiode.

In another example, a pixel cell is provided. The pixel cell may comprise a photodiode, a capacitor configured to store charges generated by the photodiode, and a processing circuit configured to perform at least one of a first mode of measurement and a second mode of measurement to generate data representing an intensity of light incident on the photodiode. At the first mode of measurement, the processing circuit is configured to measure a quantity of charges stored at the capacitor when the capacitor is electrically coupled with the photodiode. At the second mode of measurement, the processing circuit is configured to measure a quantity of charges stored at the capacitor when the capacitor is electrically isolated from the photodiode.

In some aspects, the processing circuit may comprise a variable threshold generator, a comparator, and a counter. At the first mode of measurement, the variable threshold generator may be configured to generate a fixed threshold voltage. The comparator may be configured to compare the fixed threshold voltage against a voltage representing the quantity of charges stored at the capacitor to generate a decision output. The counter may be configured to generate a set of count values based on the decision output. One or more of the set of count values generated by the counter corresponding to a change in the decision output may represent an intensity of light incident on the photodiode. The one or more of the set of count values decreases when the intensity of light incident on the photodiode increases. The fixed threshold voltage corresponds to a saturation light intensity for the photodiode.

In some aspects, at the second mode of measurement, the variable threshold generator may be configured to generate a ramping voltage based on a set of count values generated by the counter. The comparator may be configured to compare the ramping voltage against a voltage representing the quantity of charges stored at the capacitor to generate a decision output. The counter may be configured to generate the set of count values based on the decision output. One or more of the set of count values generated by the counter corresponding to a change in the decision output may represent an intensity of light incident on the photodiode. The one or more of the set of count values increases when the intensity of light incident on the photodiode increases.

In some aspects, the processing circuit is configured to skip the second mode of measurement based on a determination, from the first mode of measurement, that a quantity of charges stored at the capacitor when the photodiode is electrically coupled with the photodiode exceeds a threshold.

BRIEF DESCRIPTION OF THE DRAWINGS

Illustrative embodiments are described with reference to the following figures.

Figure 1A:
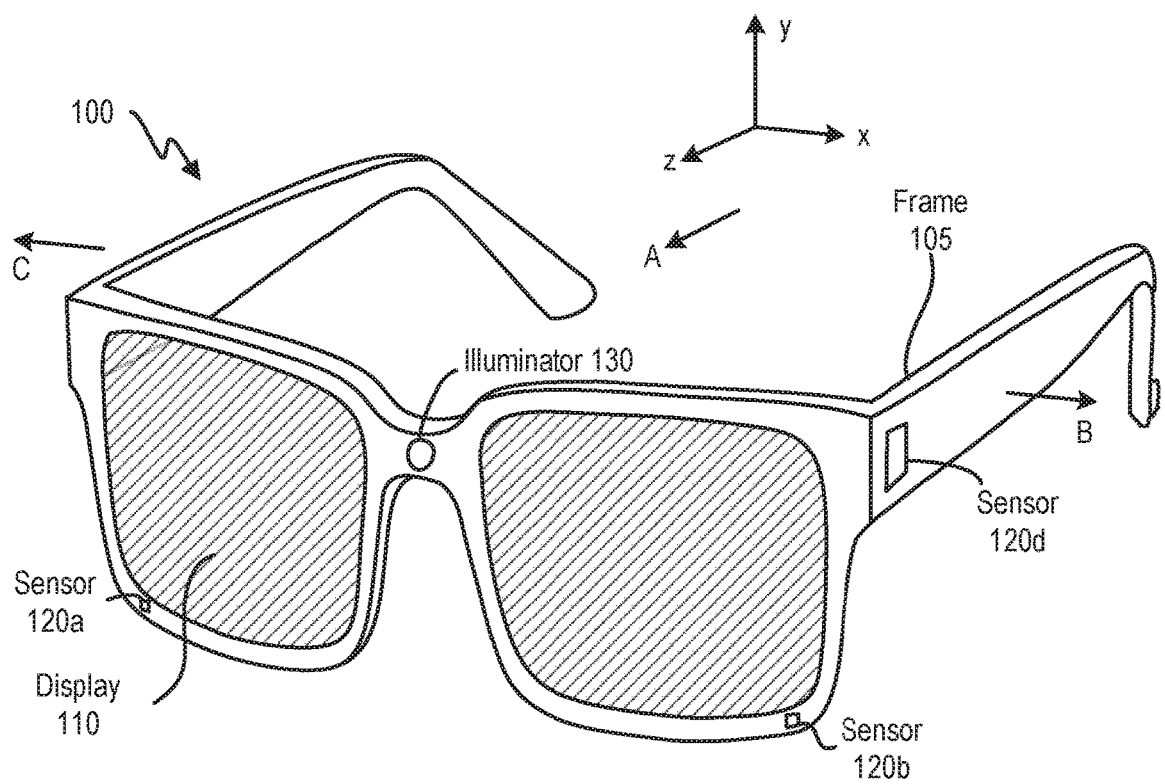
FIGS. 1A and 1B are diagram of an embodiment of a near-eye display.
Figure 1A:
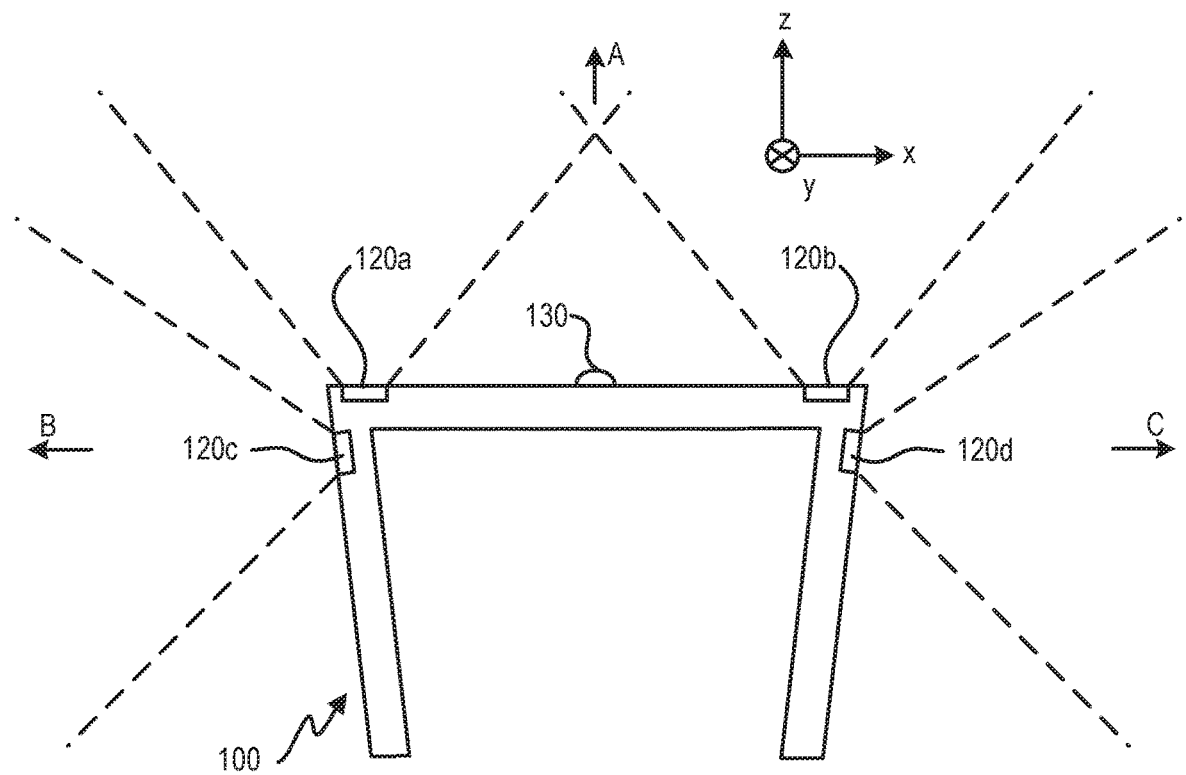

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

In the appended figures, similar components and/or features may have the same reference label. Further, various components of the same type may be distinguished by following the reference label by a dash and a second label that distinguishes among the similar components. If only the first reference label is used in the specification, the description is applicable to any one of the similar components having the same first reference label irrespective of the second reference label.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

This disclosure relates generally to image sensor. More specifically, and without limitation, this disclosure relates to a pixel cell with a stack structure, with the photodiode of the pixel cell stacked over at least a part of the circuitries for converting the output of the photodiode into digital signals. By providing a stack structure, the footprint of a pixel cell can be reduced, which allows more pixel cells to be included in an image sensor, which can improve the resolution of the image sensor. Moreover, the stack structure also allows each pixel cell to have dedicated circuitries for digitizing the output of the photodiode, which can increase the rate at which the pixel cell generates the digital output. All these can improve the performance of an application (e.g., a VR/AR/MR system) that relies on the digital output of the pixel cell, as well as user experience.

This disclosure also relates to operating a pixel cell to perform light intensity measurement under two modes of measurements. The pixel cell may include a photodiode, and a capacitor configured to store charges generated by the photodiode. In a first mode of measurement, the pixel cell may be operated to measure the light intensity based on the charges stored in the capacitor when the capacitor is electrically coupled with the photodiode. In a second mode of measurement, the pixel cell may be operated to measure the charges stored in the capacitor when the capacitor is electrically isolated from the photodiode. With the two different measurement modes, the pixel cell may be able to generate digital output that tracks the intensity of incident light, when the intensity exceeds the saturation limit of the photodiode. This can extend the dynamic range of the pixel cell, and can also improve the performance of an application (e.g., a VR/AR/MR system) that relies on the digital output of the pixel cell, as well as user experience.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

FIG. 1A is a diagram of an embodiment of a near-eye display 100. Near-eye display 100 presents media to a user. Examples of media presented by near-eye display 100 include one or more images, video, and/or audio. In some embodiments, audio is presented via an external device (e.g., speakers and/or headphones) that receives audio information from the near-eye display 100, a console, or both, and presents audio data based on the audio information. Near-eye display 100 is generally configured to operate as a virtual reality (VR) display. In some embodiments, near-eye display 100 is modified to operate as an augmented reality (AR) display and/or a mixed reality (MR) display.

Near-eye display 100 includes a frame 105 and a display 110. Frame 105 is coupled to one or more optical elements. Display 110 is configured for the user to see content presented by near-eye display 100. In some embodiments, display 110 comprises a waveguide display assembly for directing light from one or more images to an eye of the user.

Near-eye display 100 further includes image sensors 120a, 120b, 120c, and 120d. Each of image sensors 120a, 120b, 120c, and 120d may include a pixel array configured to generate image data representing different fields of views to along different directions. For example, sensors 120a and 120b may be configured to provide image data representing two field of views towards a direction A along the Z axis, whereas sensor 120c may be configured to provide image data representing a field of view towards a direction B along the X axis, and sensor 120d may be configured to provide image data representing a field of view towards a direction C along the X axis.

In some embodiments, sensors 120a-120d can be configured as input devices to control or influence the display content of the near-eye display 100, to provide an interactive VR/AR/MR experience to a user who wears near-eye display 100. For example, sensors 120a-120d can generate physical image data of a physical environment in which the user is located. The physical image data can be provided to a location tracking system to track a location and/or a path of movement of the user in the physical environment. A system can then update the image data provided to display 110 based on, for example, the location and orientation of the user, to provide the interactive experience. In some embodiments, the location tracking system may operate a SLAM algorithm to track a set of objects in the physical environment and within a view of field of the user as the user moves within the physical environment. The location tracking system can construct and update a map of the physical environment based on the set of objects, and track the location of the user within the map. By providing image data corresponding to multiple fields of views, sensors 120a-120d can provide the location tracking system a more holistic view of the physical environment, which can lead to more objects to be included in the construction and updating of the map. With such arrangement, the accuracy and robustness of tracking a location of the user within the physical environment can be improved.

In some embodiments, near-eye display 100 may further include one or more active illuminator 130 to project light into the physical environment. The light projected can be associated with different frequency spectrums (e.g., visible light, infra-red light, ultra-violet light, etc.), and can serve various purposes. For example, illuminator 130 may project light in a dark environment (or in an environment with low intensity of infra-red light, ultra-violet light, etc.) to assist sensors 120a-120d in capturing images of different objects within the dark environment to, for example, enable location tracking of the user. Illuminator 130 may project certain markers onto the objects within the environment, to assist the location tracking system in identifying the objects for map construction/updating.

In some embodiments, illuminator 130 may also enable stereoscopic imaging. For example, one or more of sensors 120a or 120b can include both a first pixel array for visible light sensing and a second pixel array for infra-red (IR) light sensing. The first pixel array can be overlaid with a color filter (e.g., a Bayer filter), with each pixel of the first pixel array being configured to measure intensity of light associated with a particular color (e.g., one of red, green or blue colors). The second pixel array (for IR light sensing) can also be overlaid with a filter that allows only IR light through, with each pixel of the second pixel array being configured to measure intensity of IR lights. The pixel arrays can generate an RGB image and an IR image of an object, with each pixel of the IR image being mapped to each pixel of the RGB image. Illuminator 130 may project a set of IR markers on the object, the image of which can be captured by the IR pixel array. Based on a distribution of the IR markers of the object as shown in the image, the system can estimate a distance of different parts of the object from the IR pixel array, and to generate a stereoscopic image of the object based on the distances. Based on the stereoscopic image of the object, the system can determine, for example, a relative position of the object with respect to the user, and can update the image data provided to display 100 based on the relative position information to provide the interactive experience.

As discussed above, near-eye display 100 may be operated in environments associated with a very wide range of light intensities. For example, near-eye display 100 may be operated in an indoor environment or in an outdoor environment, and/or at different times of the day. Near-eye display 100 may also operate with or without active illuminator 130 being turned on. As a result, image sensors 120a-120d may need to have a wide dynamic range to be able to operate properly (e.g., to generate an output that correlates with the intensity of incident light) across a very wide range of light intensities associated with different operating environments for near-eye display 100.

Figure 1B:
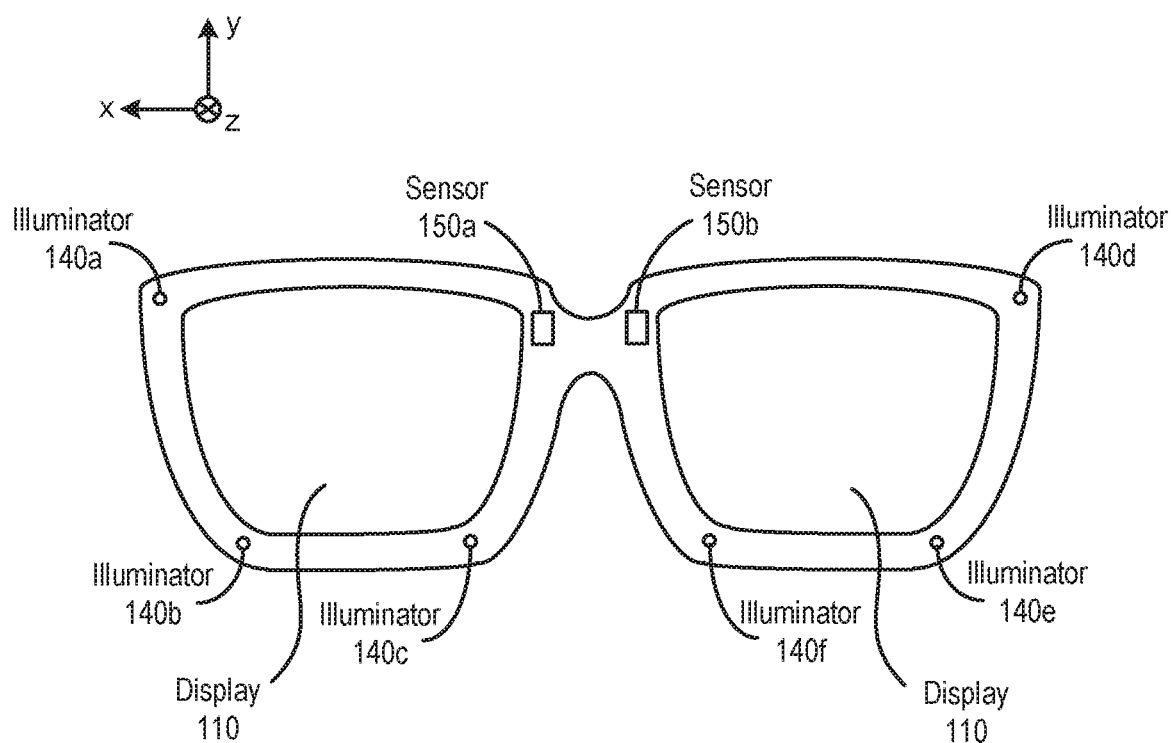
Figure 1B:
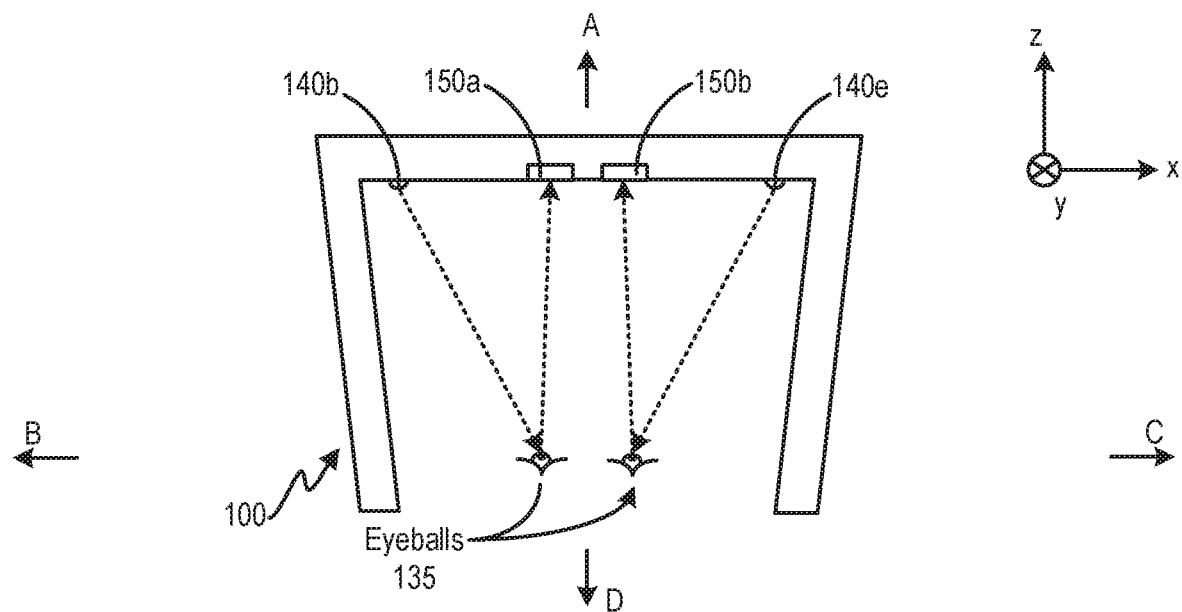

FIG. 1B is a diagram of another embodiment of near-eye display 100. FIG. 1B illustrates a side of near-eye display 100 that faces the eyeball(s) 135 of the user who wears near-eye display 100. As shown in FIG. 1B, near-eye display 100 may further include a plurality of illuminators 140a, 140b, 140c, 140d, 140e, and 140f. Near-eye display 100 further includes a plurality of image sensors 150a and 150b. Illuminators 140a, 140b, and 140c may emit lights of certain frequency range (e.g., NIR) towards direction D (which is opposite to direction A of FIG. 1A). The emitted light may be associated with a certain pattern, and can be reflected by the left eyeball of the user. Sensor 150a may include a pixel array to receive the reflected light and generate an image of the reflected pattern. Similarly, illuminators 140d, 140e, and 140f may emit NIR lights carrying the pattern. The NIR lights can be reflected by the right eyeball of the user, and may be received by sensor 150b. Sensor 150b may also include a pixel array to generate an image of the reflected pattern. Based on the images of the reflected pattern from sensors 150a and 150b, the system can determine a gaze point of the user, and update the image data provided to display 100 based on the determined gaze point to provide an interactive experience to the user.

As discussed above, to avoid damaging the eyeballs of the user, illuminators 140a, 140b, 140c, 140d, 140e, and 140f are typically configured to output lights of very low intensities. In a case where image sensors 150a and 150b comprise the same sensor devices as image sensors 120a-120d of FIG. 1A, the image sensors 120a-120d may need to be able to generate an output that correlates with the intensity of incident light when the intensity of the incident light is very low, which may further increase the dynamic range requirement of the image sensors.

Moreover, the image sensors 120a-120d may need to be able to generate an output at a high speed to track the movements of the eyeballs. For example, a user's eyeball can perform a very rapid movement (e.g., a saccade movement) in which there can be a quick jump from one eyeball position to another. To track the rapid movement of the user's eyeball, image sensors 120a-120d need to generate images of the eyeball at high speed. For example, the rate at which the image sensors generate an image frame (the frame rate) needs to at least match the speed of movement of the eyeball. The high frame rate requires short total exposure time for all of the pixel cells involved in generating the image frame, as well as high speed for converting the sensor outputs into digital values for image generation. Moreover, as discussed above, the image sensors also need to be able to operate at an environment with low light intensity.

Figure 2:
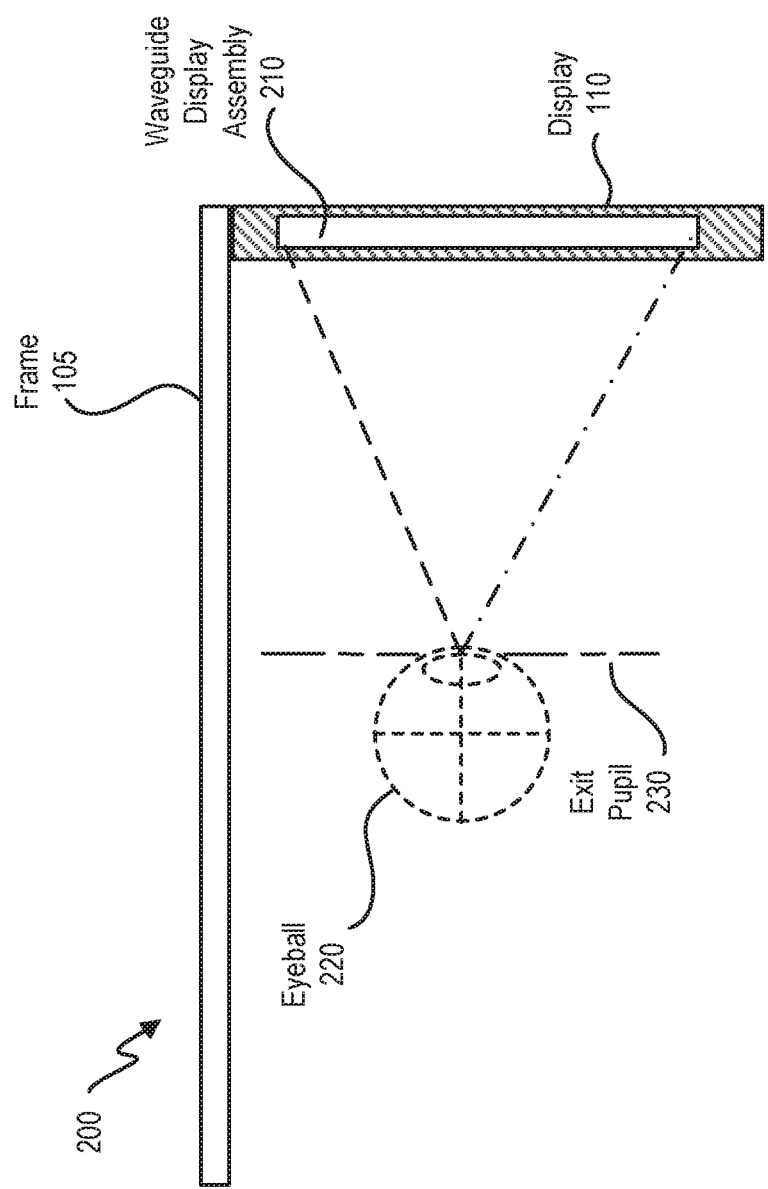
FIG. 2 is an embodiment of a cross section of the near-eye display.

FIG. 2 is an embodiment of a cross section 200 of near-eye display 100 illustrated in FIG. 1. Display 110 includes at least one waveguide display assembly 210. An exit pupil 230 is a location where a single eyeball 220 of the user is positioned in an eyebox region when the user wears the near-eye display 100. For purposes of illustration, FIG. 2 shows the cross section 200 associated eyeball 220 and a single waveguide display assembly 210, but a second waveguide display is used for a second eye of a user.

Waveguide display assembly 210 is configured to direct image light to an eyebox located at exit pupil 230 and to eyeball 220. Waveguide display assembly 210 may be composed of one or more materials (e.g., plastic, glass, etc.) with one or more refractive indices. In some embodiments, near-eye display 100 includes one or more optical elements between waveguide display assembly 210 and eyeball 220.

In some embodiments, waveguide display assembly 210 includes a stack of one or more waveguide displays including, but not restricted to, a stacked waveguide display, a varifocal waveguide display, etc. The stacked waveguide display is a polychromatic display (e.g., a red-green-blue (RGB) display) created by stacking waveguide displays whose respective monochromatic sources are of different colors. The stacked waveguide display is also a polychromatic display that can be projected on multiple planes (e.g., multi-planar colored display). In some configurations, the stacked waveguide display is a monochromatic display that can be projected on multiple planes (e.g., multi-planar monochromatic display). The varifocal waveguide display is a display that can adjust a focal position of image light emitted from the waveguide display. In alternate embodiments, waveguide display assembly 210 may include the stacked waveguide display and the varifocal waveguide display.

Figure 3:
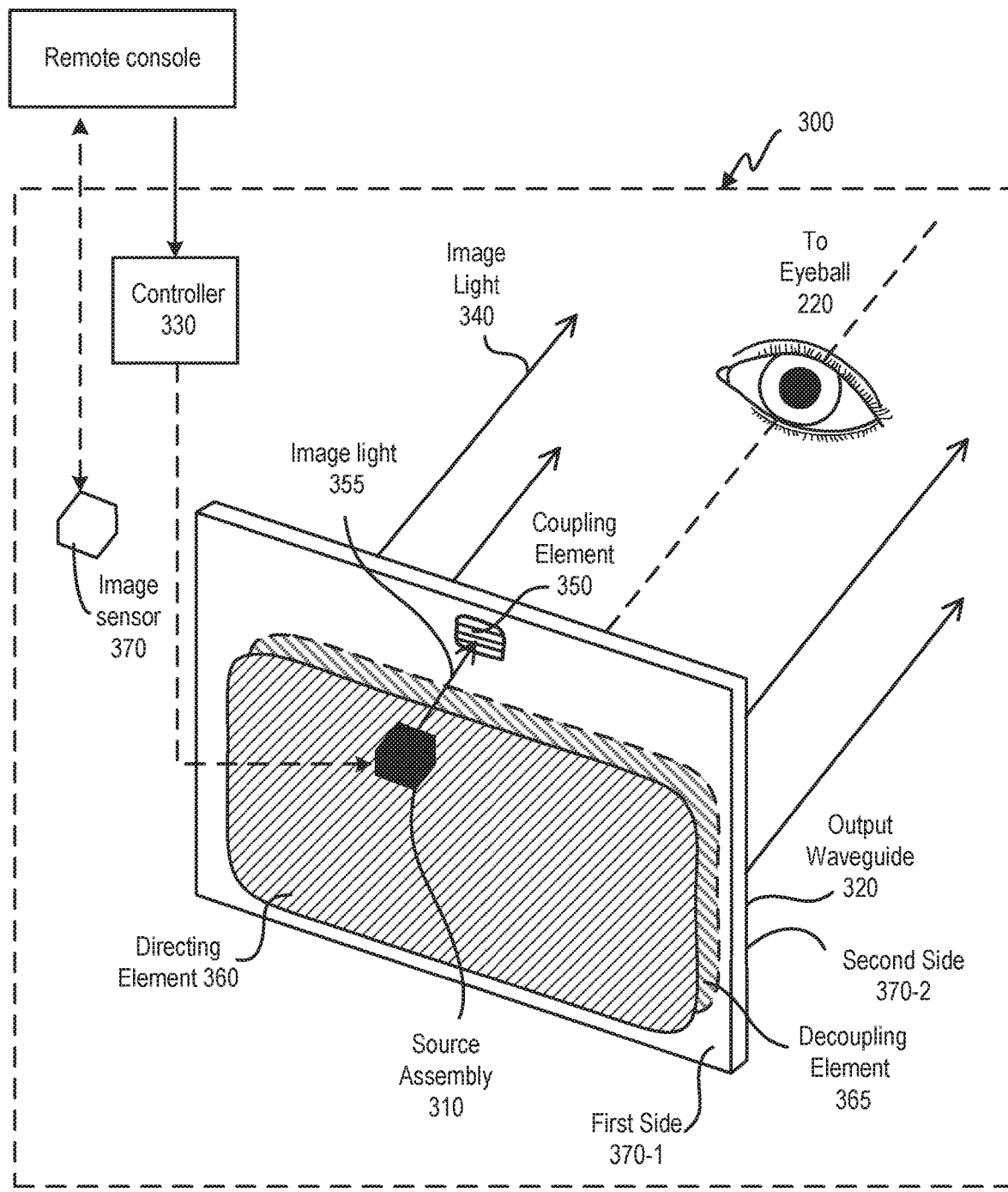
FIG. 3 illustrates an isometric view of an embodiment of a waveguide display with a single source assembly.

FIG. 3 illustrates an isometric view of an embodiment of a waveguide display 300. In some embodiments, waveguide display 300 is a component (e.g., waveguide display assembly 210) of near-eye display 100. In some embodiments, waveguide display 300 is part of some other near-eye display or other system that directs image light to a particular location.

Waveguide display 300 includes a source assembly 310, an output waveguide 320, and a controller 330. For purposes of illustration, FIG. 3 shows the waveguide display 300 associated with a single eyeball 220, but in some embodiments, another waveguide display separate, or partially separate, from the waveguide display 300 provides image light to another eye of the user.

Source assembly 310 generates image light 355. Source assembly 310 generates and outputs image light 355 to a coupling element 350 located on a first side 370-1 of output waveguide 320. Output waveguide 320 is an optical waveguide that outputs expanded image light 340 to an eyeball 220 of a user. Output waveguide 320 receives image light 355 at one or more coupling elements 350 located on the first side 370-1 and guides received input image light 355 to a directing element 360. In some embodiments, coupling element 350 couples the image light 355 from source assembly 310 into output waveguide 320. Coupling element 350 may be, e.g., a diffraction grating, a holographic grating, one or more cascaded reflectors, one or more prismatic surface elements, and/or an array of holographic reflectors.

Directing element 360 redirects the received input image light 355 to decoupling element 365 such that the received input image light 355 is decoupled out of output waveguide 320 via decoupling element 365. Directing element 360 is part of, or affixed to, first side 370-1 of output waveguide 320. Decoupling element 365 is part of, or affixed to, second side 370-2 of output waveguide 320, such that directing element 360 is opposed to the decoupling element 365. Directing element 360 and/or decoupling element 365 may be, e.g., a diffraction grating, a holographic grating, one or more cascaded reflectors, one or more prismatic surface elements, and/or an array of holographic reflectors.

Second side 370-2 represents a plane along an x-dimension and a y-dimension. Output waveguide 320 may be composed of one or more materials that facilitate total internal reflection of image light 355. Output waveguide 320 may be composed of e.g., silicon, plastic, glass, and/or polymers. Output waveguide 320 has a relatively small form factor. For example, output waveguide 320 may be approximately 50 mm wide along x-dimension, 30 mm long along y-dimension and 0.5-1 mm thick along a z-dimension.

Controller 330 controls scanning operations of source assembly 310. The controller 330 determines scanning instructions for the source assembly 310. In some embodiments, the output waveguide 320 outputs expanded image light 340 to the user's eyeball 220 with a large field of view (FOV). For example, the expanded image light 340 provided to the user's eyeball 220 with a diagonal FOV (in x and y) of 60 degrees and/or greater and/or 150 degrees and/or less. The output waveguide 320 is configured to provide an eyebox with a length of 20 mm or greater and/or equal to or less than 50 mm; and/or a width of 10 mm or greater and/or equal to or less than 50 mm.

Moreover, controller 330 also controls image light 355 generated by source assembly 310, based on image data provided by image sensor 370. Image sensor 370 may be located on first side 370-1 and may include, for example, image sensors 120a-120d of FIG. 1A to generate image data of a physical environment in front of the user (e.g., for location determination). Image sensor 370 may also be located on second side 370-2 and may include image sensors 150a and 150b of FIG. 1B to generate image data of eyeball 220 (e.g., for gaze point determination) of the user. Image sensor 370 may interface with a remote console that is not located within waveguide display 300. Image sensor 370 may provide image data to the remote console, which may determine, for example, a location of the user, a gaze point of the user, etc., and determine the content of the images to be displayed to the user. The remote console can transmit instructions to controller 330 related to the determined content. Based on the instructions, controller 330 can control the generation and outputting of image light 355 by source assembly 310.

Figure 4:
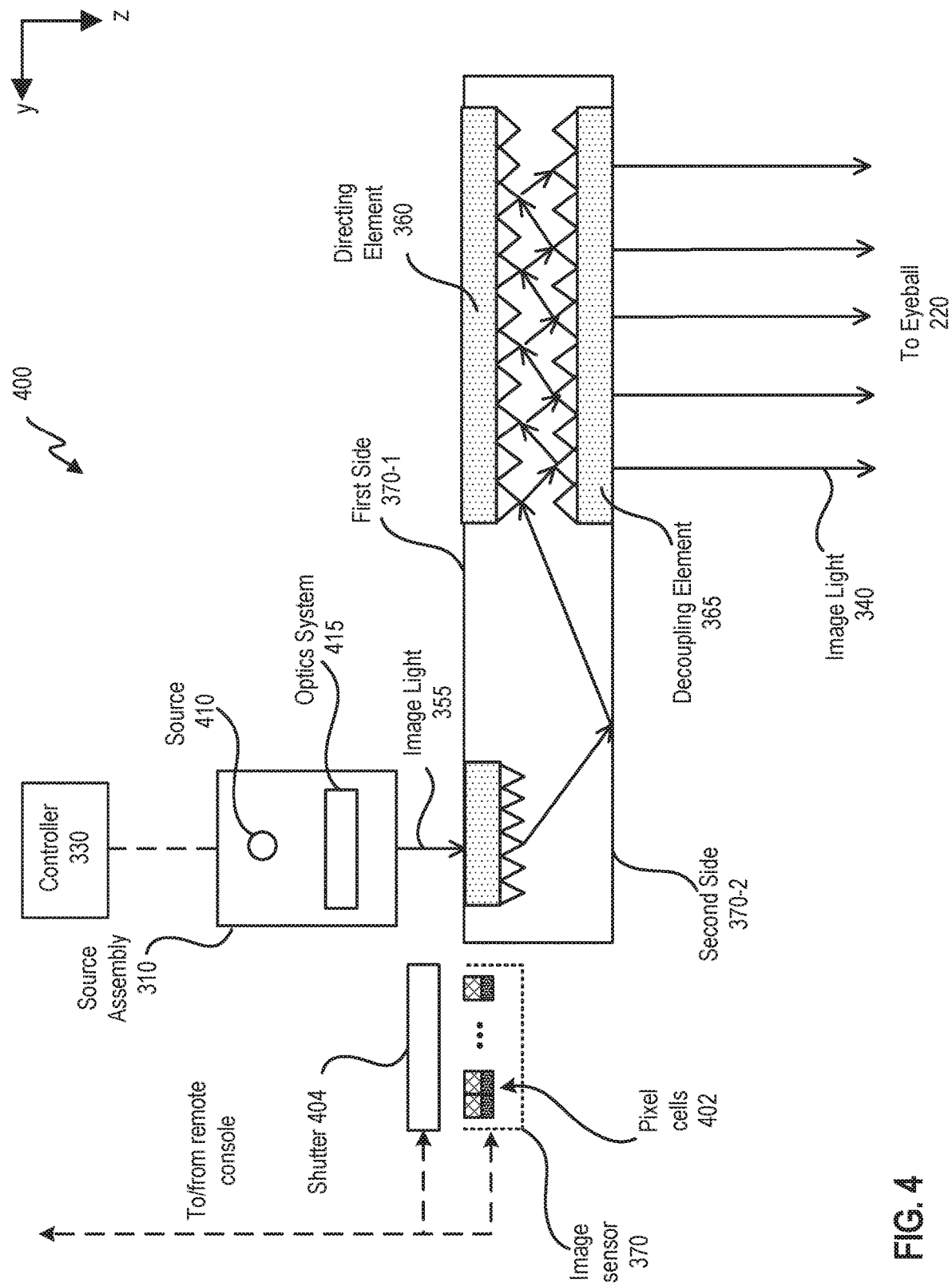
FIG. 4 illustrates a cross section of an embodiment of the waveguide display.

FIG. 4 illustrates an embodiment of a cross section 400 of the waveguide display 300. The cross section 400 includes source assembly 310, output waveguide 320, and image sensor 370. In the example of FIG. 4, image sensor 370 may include a set of pixel cells 402 located on first side 370-1 to generate image of the physical environment in front of the user. In some embodiments, there can be a mechanical shutter 404 interposed between the set of pixel cells 402 and the physical environment to control the exposure of the set of pixel cells 402. In some embodiments, the mechanical shutter 404 can be replaced by an electronic shutter gate, as to be discussed below. Each of pixel cells 402 may correspond to one pixel of the image. Although not shown in FIG. 4, it is understood that each of pixel cells 402 may also be overlaid with a filter to control the frequency range of the light to be sensed by the pixel cells.

After receiving instructions from the remote console, mechanical shutter 404 can open and expose the set of pixel cells 402 in an exposure period. During the exposure period, image sensor 370 can obtain samples of lights incident on the set of pixel cells 402, and generate image data based on an intensity distribution of the incident lights samples detected by the set of pixel cells 402. Image sensor 370 can then provide the image data to the remote console, which determines the display content, and provide the display content information to controller 330. Controller 330 can then determine image light 355 based on the display content information.

Source assembly 310 generates image light 355 in accordance with instructions from the controller 330. Source assembly 310 includes a source 410 and an optics system 415. Source 410 is a light source that generates coherent or partially coherent light. Source 410 may be, e.g., a laser diode, a vertical cavity surface emitting laser, and/or a light emitting diode.

Optics system 415 includes one or more optical components that condition the light from source 410. Conditioning light from source 410 may include, e.g., expanding, collimating, and/or adjusting orientation in accordance with instructions from controller 330. The one or more optical components may include one or more lens, liquid lens, mirror, aperture, and/or grating. In some embodiments, optics system 415 includes a liquid lens with a plurality of electrodes that allows scanning of a beam of light with a threshold value of scanning angle to shift the beam of light to a region outside the liquid lens. Light emitted from the optics system 415 (and also source assembly 310) is referred to as image light 355.

Output waveguide 320 receives image light 355. Coupling element 350 couples image light 355 from source assembly 310 into output waveguide 320. In embodiments where coupling element 350 is diffraction grating, a pitch of the diffraction grating is chosen such that total internal reflection occurs in output waveguide 320, and image light 355 propagates internally in output waveguide 320 (e.g., by total internal reflection), toward decoupling element 365.

Directing element 360 redirects image light 355 toward decoupling element 365 for decoupling from output waveguide 320. In embodiments where directing element 360 is a diffraction grating, the pitch of the diffraction grating is chosen to cause incident image light 355 to exit output waveguide 320 at angle(s) of inclination relative to a surface of decoupling element 365.

In some embodiments, directing element 360 and/or decoupling element 365 are structurally similar. Expanded image light 340 exiting output waveguide 320 is expanded along one or more dimensions (e.g., may be elongated along x-dimension). In some embodiments, waveguide display 300 includes a plurality of source assemblies 310 and a plurality of output waveguides 320. Each of source assemblies 310 emits a monochromatic image light of a specific band of wavelength corresponding to a primary color (e.g., red, green, or blue). Each of output waveguides 320 may be stacked together with a distance of separation to output an expanded image light 340 that is multi-colored.

Figure 5:
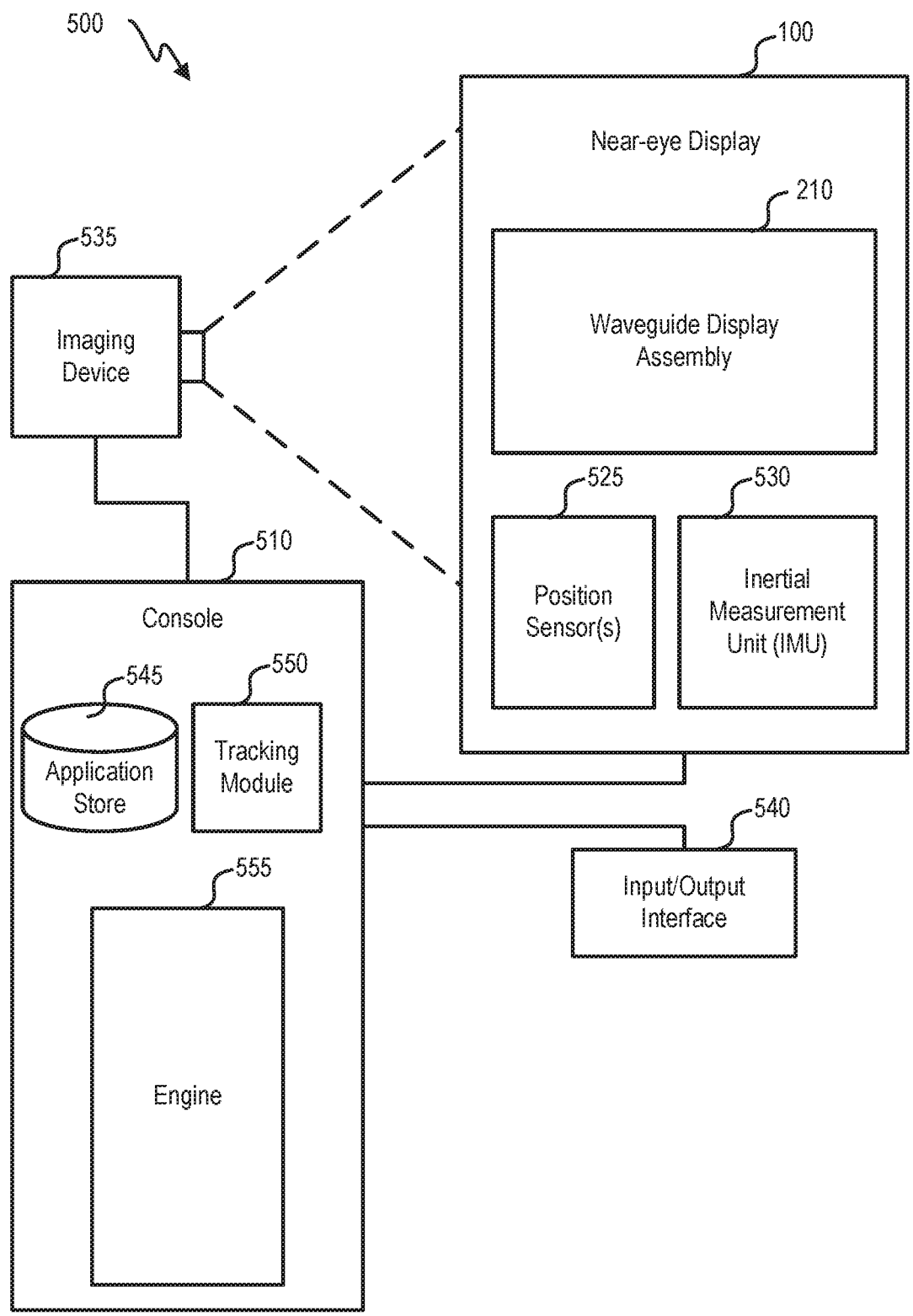
FIG. 5 is a block diagram of an embodiment of a system including the near-eye display.

FIG. 5 is a block diagram of an embodiment of a system 500 including the near-eye display 100. The system 500 comprises near-eye display 100, an imaging device 535, an input/output interface 540, and image sensors 120a-120d and 150a-150b that are each coupled to a console 510.

The near-eye display 100 is a display that presents media to a user. Examples of media presented by the near-eye display 100 include one or more images, video, and/or audio. In some embodiments, audio is presented via an external device (e.g., speakers and/or headphones) that receives audio information from the near-eye display 100 and/or the console 510 and presents audio data based on the audio information to a user. In some embodiments, the near-eye display 100 may also act as an AR eyewear glass. In some embodiments, the near-eye display 100 augments views of a physical, real-world environment, with computer-generated elements (e.g., images, video, sound, etc.).

The near-eye display 100 includes waveguide display assembly 210, one or more position sensors 525, and/or an inertial measurement unit (IMU) 530. Waveguide display assembly 210 includes source assembly 310, output waveguide 320, and controller 330.

IMU 530 is an electronic device that generates fast calibration data indicating an estimated position of the near-eye display 100 relative to an initial position of the near-eye display 100 based on measurement signals received from one or more of the position sensors 525.

Imaging device 535 may generate image data for various applications. For example, imaging device 535 may generate image data to provide slow calibration data in accordance with calibration parameters received from the console 510. Imaging device 535 may include, for example, image sensors 120a-120d of FIG. 1A for generating image data of a physical environment in which the user is located, for performing location tracking of the user. Imaging device 535 may further include, for example, image sensors 150a-150b of FIG. 1B for generating image data for determining a gaze point of the user, to identify an object of interest of the user.

The input/output interface 540 is a device that allows a user to send action requests to the console 510. An action request is a request to perform a particular action. For example, an action request may be to start or end an application or to perform a particular action within the application.

The console 510 provides media to the near-eye display 100 for presentation to the user in accordance with information received from one or more of: imaging device 535, near-eye display 100, and input/output interface 540. In the example shown in FIG. 5, the console 510 includes an application store 545, a tracking module 550, and an engine 555.

The application store 545 stores one or more applications for execution by the console 510. An application is a group of instructions, that when executed by a processor, generates content for presentation to the user. Examples of applications include: gaming applications, conferencing applications, video playback application, or other suitable applications.

Tracking module 550 calibrates system 500 using one or more calibration parameters and may adjust one or more calibration parameters to reduce error in determination of the position of the near-eye display 100.

Tracking module 550 tracks movements of near-eye display 100 using slow calibration information from the imaging device 535. Tracking module 550 also determines positions of a reference point of near-eye display 100 using position information from the fast calibration information.

Engine 555 executes applications within system 500 and receives position information, acceleration information, velocity information, and/or predicted future positions of near-eye display 100 from tracking module 550. In some embodiments, information received by engine 555 may be used for producing a signal (e.g., display instructions) to waveguide display assembly 210 that determines a type of content presented to the user. For example, to provide an interactive experience, engine 555 may determine the content to be presented to the user based on a location of the user (e.g., provided by tracking module 550), a gaze point of the user (e.g., based on image data provided by imaging device 535), a distance between an object and user (e.g., based on image data provided by imaging device 535).

Figure 6A:
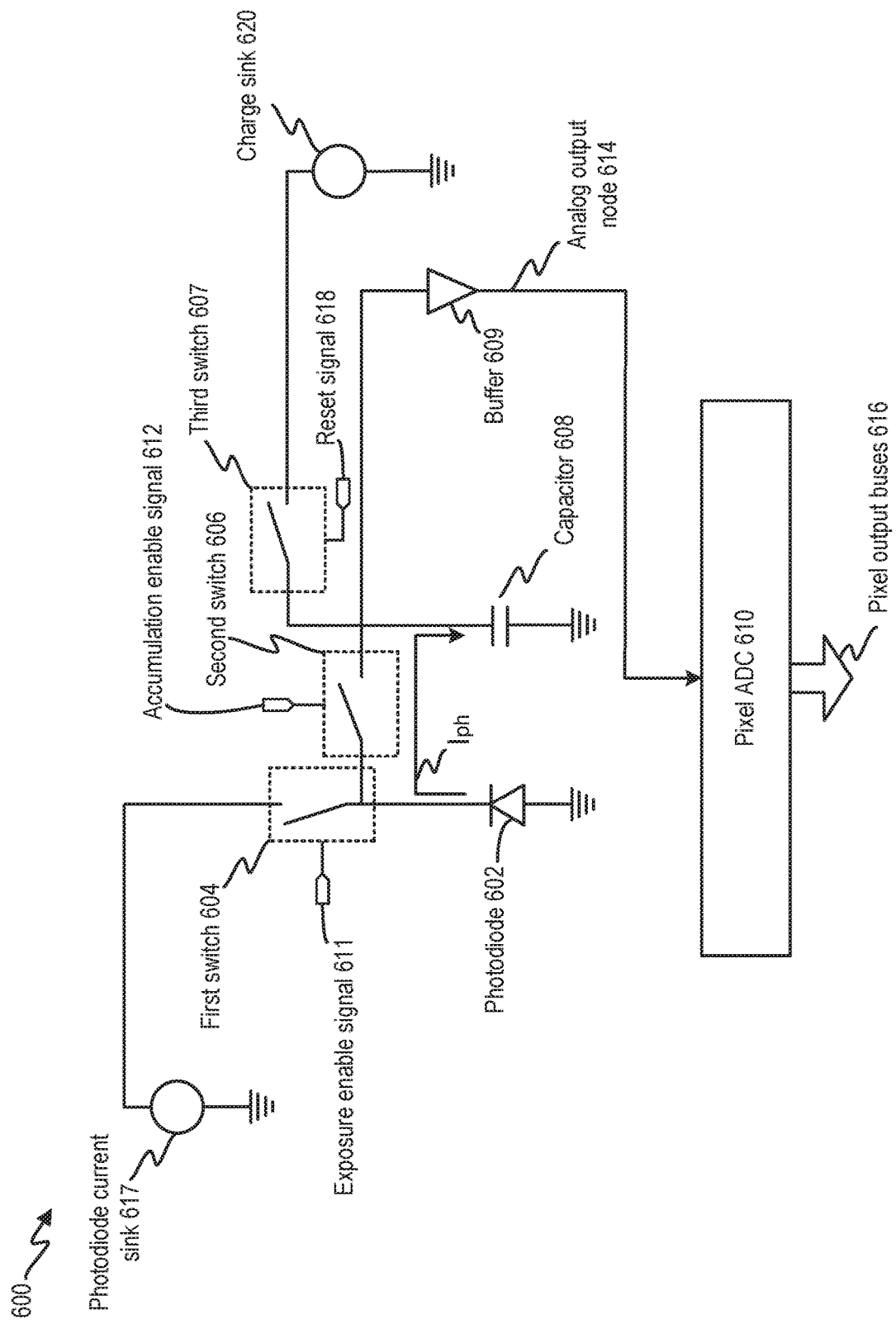
FIGS. 6A, 6B, and 6C are block diagrams of embodiments of a pixel cell.
Figure 6B:
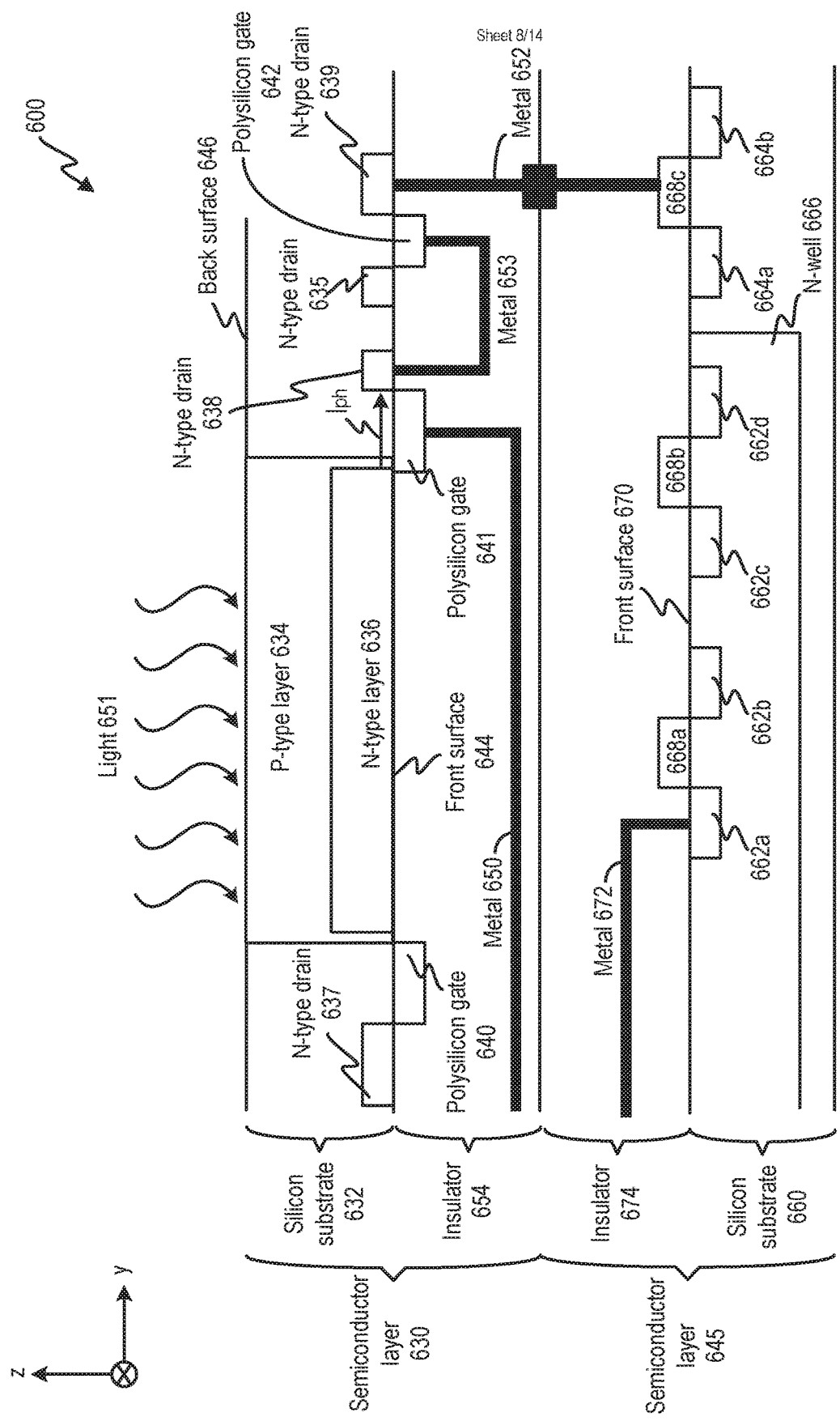
Figure 6C:
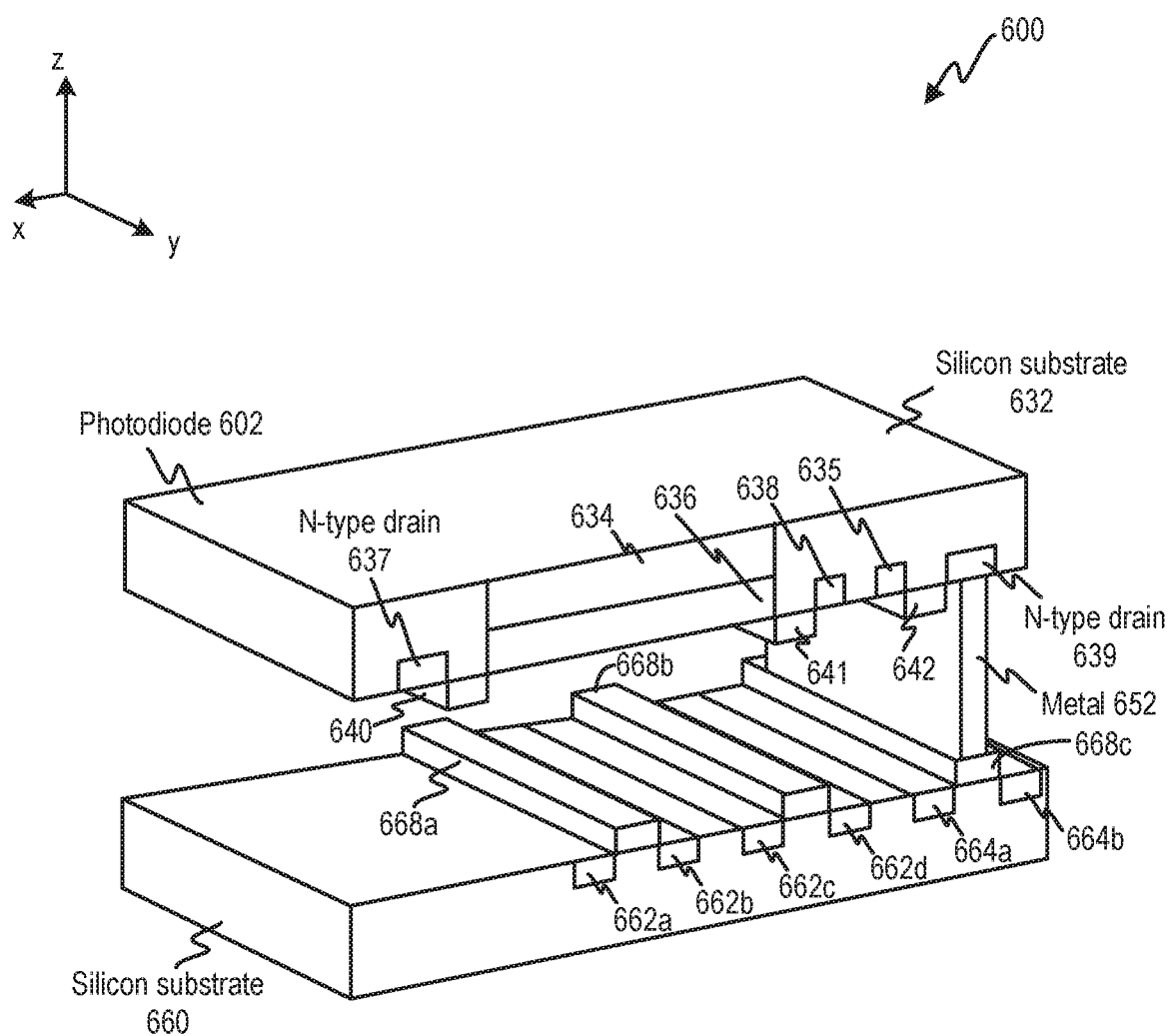

FIG. 6A-6C illustrate an example of a pixel cell 600. Pixel cell 600 may be part of a pixel array and can generate digital intensity data corresponding to a pixel of an image. For example, pixel cell 600 may be part of pixel cells 402 of FIG. 4. FIG. 6A illustrates a circuit schematic representation of pixel cell 600, whereas FIGS. 6B and 6C illustrate a device structure of pixel cell 600. As shown in FIG. 6A, pixel cell 600 may include a photodiode 602, a first switch 604, a second switch 606, a third switch 607, a capacitor 608, a buffer 609, and a pixel ADC 610. In some embodiments, photodiode 602 may include a P-N diode or a P-I-N diode. Each of first switch 604, second switch 606, and third switch 607 can include a transistor. The transistor may include, for example, a metal-oxide-semiconductor field-effect transistor (MOSFET), a bipolar junction transistor (BJT), etc. Capacitor 608 can be a floating terminal of the transistor of first switch 604. The floating terminal can be, for example, a drain terminal (for a MOSFET), a collector terminal (for a BJT), etc., with parasitic capacitances capable of storing charges, to establish a voltage. Buffer 609 can be configured to provide a voltage buffer between capacitor 608 and ADC 610. For the rest of the disclosure, it is assumed that both first switch 604, second switch 606, third switch 607 are MOSFET transistors, and that buffer 609 also comprises MOSFET transistors configured as a source follower. Pixel ADC 610 may include any circuitries that provide a digital representation of the intensity of incident light. Examples of pixel ADC 610 are provided below.

In some embodiments, first switch 604 can act as an electronic shutter gate (in lieu of or in combination with mechanical shutter 404 of FIG. 4) to control an exposure period of pixel 600. During the exposure period, first switch 604 can be disabled (turned off) by exposure enable signal 611, whereas second switch 606 can be enabled (turned on) by accumulation enable signal 612. During the exposure period, photodiode 602 can sense the incident light by converting photons into charges and generating photocurrent $I_{ph}$. The quantity of photocurrent $I_{ph}$ may correlate to the intensity of the incident light if photodiode 602 is not saturated. The charges can flow out of the cathode of photodiode 602 and into capacitor 608 via second switch 606, and an analog voltage may be developed at capacitor 608. Buffer 609 can sense the analog voltage and generate a replica of the analog voltage (but with larger driving strength) at analog output node 614. The quantity of charges accumulated at capacitor 608 (or the change in the quantity of charges) correlates to the magnitude of photocurrent $I_{ph}$, whereas the analog voltage developed at analog output node 614 correlates to the magnitude of photocurrent $I_{ph}$. As to be discussed below, during the exposure period, the analog voltage at analog output node 614 can be converted into a set of digital data (e.g., comprising logical ones and zeros) by pixel ADC 610. The digital data can be transmitted by a set of pixel output buses 616 to, for example, console 510 of FIG. 5, to represent the light intensity during the exposure period.

After the exposure period completes, an optional static measurement period may follow in which first switch 604 and second switch 606 can be controlled to preserve the charges accumulated at capacitor 608, so that the quantity of charges accumulated at capacitor 608 (or the change in the quantity of stored charges) correlates to the intensity of light captured during the exposure period. For example, first switch 604 can be enabled (turned on) by exposure enable signal 611 to steer any photocurrent generated by photodiode 602 away from capacitor 608 and into a photodiode current sink 617. Second switch 606 can also be disabled (turned off) by accumulation enable signal 612 to prevent photocurrents from charging/discharging capacitor 608. As to be discussed below, during the static measurement period the analog voltage at analog output node 614 (which reflects the total charges stored at capacitor 608) can also be converted into another set of digital data, to represent the light intensity during the exposure period.

Following the end of the exposure period (and optionally, the static measurement period), pixel cell 600 can be operated in a reset period, to remove the charges stored in capacitor 608. During the reset period, first switch 604 can remain enabled to steer the photocurrent away from capacitor 608, whereas second switch 606 can also remain disabled to prevent photocurrent from entering capacitor 608. Further, third switch 607 can be enabled by a reset signal 618 to connect capacitor 608 to charge sink 620, to remove the stored charges at capacitor 608. In a case where the photocurrent comprises negative charges, both photodiode current sink 617 and charge sink 620 can be voltage sources with a positive voltage to attract the negative charges. In a case where the photocurrent comprises positive charges, both photodiode current sink 617 and charge sink 620 can be voltage sources with a ground or negative voltage to attract the positive charges. After the reset period ends, pixel cell 600 can be exposed again to obtain new samples of light intensity.

In some embodiments, in a case where the exposure of pixel cell 600 is controlled by a mechanical shutter (e.g., mechanical shutter 404), first switch 604 can be omitted, whereas third switch 607 (and charge sink 620) can still function as a reset switch In such a case, during the reset period, with the mechanical shutter blocking pixel cell 600 from incident light, both third switch 607 and second switch 606 can be enabled to remove the charges stored at capacitor 608 at the same time when photodiode 602 is not generating photocurrent. During the exposure phase, third switch 607 can be disabled and second switch 606 can be enabled to allow photocurrent generated by photodiode 602 to flow into capacitor 608. ADC 610 can generating digital signals representing the charges stored at capacitor 608 at any time point during the exposure phase. Moreover, at the end of the exposure phase, second switch 606 can also be disabled in the static measurement phase, to allow ADC 610 to measure the total charge accumulated during the exposure phase.

By providing a pixel ADC 610 in pixel cell 600, each pixel cell 600 of a pixel array can be exposed to incident lights and generate digital representations of the incident light intensity received at the pixel cell simultaneously, to provide a global shutter operation. For high speed motion capture, global shutter is advantageous as it avoids the motion distortion problem associated with rolling shutter operation caused by rows of pixel cells capturing images of different parts of a moving object at different times. Further, compared with the conventional approach where rows of pixel cells take turns in being exposed and generating intensity data, the processing time for image generation using pixel cell 600 can be reduced. In a case where the image is used by an interactive VR/AR/MR system to perform location/eyeball tracking, the reduced image generation time can speed up the tracking, which can lead to a better user experience.

FIG. 6B illustrates a side-view of the device structure of pixel cell 600, whereas FIG. 6C illustrates a three-dimensional view of some of the components of pixel cell 600. As shown in FIG. 6B, pixel cell 600 includes two semiconductor layers 630 and 645. Semiconductor layer 630 may include a silicon substrate 632. Silicon substrate 632 may be a P-type substrate including a P-type layer 634 and an N-type layer 636, which may form photodiode 602. Silicon substrate 632 further includes N-type drain 635, N-type drain 637, N-type drain 638, and N-type drain 639. Silicon substrate 632 further includes a polysilicon gate 640, a polysilicon gate 641, and a polysilicon gate 642 on a front surface 644 of silicon substrate 632. N-type drain 637 and polysilicon gate 640 may form part of an NMOS transistor for first switch 604, whereas N-type drain 638 and polysilicon gate 641 may form part of an NMOS transistor for second switch 606. N-type drain 638 may be configured as capacitor 608. Moreover, N-type drain 635, N-type drain 639, and polysilicon gate 642 may form part of an NMOS transistor for buffer 609 (e.g., a source-follower) to buffer the voltage developed at N-type drain 638, with N-type drain 635 connected to a voltage source (not shown in FIG. 6B), polysilicon gate 642 configured as a buffer input, and N-type drain 639 configured as a buffer output. Although not shown in FIG. 6A, silicon substrate 632 may further include devices to form third switch 607 (for resetting).

Semiconductor layer 630 further includes a set of metal lines including, for example, metals 650, 652, and 653. Metal 650 may be for transmitting a signal (e.g., accumulation enable signal 612) to polysilicon gate 641, whereas metal 653 may be for transmitting the voltage at N-type drain 638 (capacitor 608) to polysilicon gate 642 for buffering by buffer 609. The output of buffer 609 can be N-type drain 639. Metal 652 may transmit the buffered voltage to semiconductor layer 645 for analog-to-digital conversion, as to be described in more details below. Both metals 650 and 652 may be made of copper. Semiconductor layer 630 may further include an insulator 654 that interfaces with silicon substrate 632 at front surface 644 and covers metals 650 and 652, N-type drains 637, 638, and 639, as well as polysilicon gates 640, 641, and 642. Insulator 654 may include, for example, silicon dioxide, to provide electrical insulation for the metals and the gate and drain/source terminals of semiconductor layer 630.

When light 651 strikes a back surface 646 of silicon substrate 632, the photons of light 651 may enter the p-n junction between P-type layer 634 and N-type layer 636 and create electron-hole pairs. Based on a voltage exerted on polysilicon gate 641 via metal 650, second switch 606 may be enabled, and an electron channel may form in a region of silicon substrate 632 between N-type layer 636 and N-type drain 638. Electrons created by the photons at the p-n junction may flow as photocurrent $I_{ph}$ from N-type layer 636 to N-type drain 638 through the electron channel. The electrons may then be accumulated at N-type drain 638 and can develop an analog voltage. A buffered version of the analog voltage can be generated at N-type drain 639 (the output of buffer 609).

In some embodiments, silicon substrate 632 may also be configured to have P-type layer 634 generating photocurrent $I_{ph}$ as positive charges. In such a case, silicon substrate 632 may include one or more N-wells surrounding P-type drains (instead of N-type drains) 637, 638, and 639 to form PMOS transistors for first switch 604, second switch 606, buffer 609 (and third switch 607 not shown in FIG. 6B).

Moreover, semiconductor layer 645 includes a silicon substrate 660. Silicon substrate 660 may include p-type drains/sources 662a, 662b, 662c, and 662d, n-type drains/sources 664a and 664b, and N-well region 666, etc. Silicon substrate 660 may further include polysilicon gates 668a, 668b, and 668c, etc. on a front surface 670. The drain/sources, N-well region, as well as the polysilicon gates can form the devices for pixel ADC 610. Semiconductor layer 645 further includes metal 652 extended from semiconductor layer 630, as well as metal 672. Metal 652 can be used to transmit the analog voltage developed at p-type drain 641 as an input to polysilicon gate 668c of pixel ADC 610. Metal 672 can be part of pixel output buses 616 for transmitting the digital representation of the analog voltage generated by pixel ADC 610. Semiconductor layer 645 may further include an insulator 674 that interfaces silicon substrate 660 at front surface 670 and covers metals 652 and 672, as well as the drain/source terminals and the polysilicon gates of silicon substrate 660, to provide electrical insulation.

In some embodiments, as shown in FIGS. 6B and 6C, semiconductor layers 630 and 645 can be stacked along the z-axis to form a stack structure, with photodiode 602 (comprising P-type layer 634 and N-type layer 636) overlapping at least partially with the devices of pixel ADC 610. With such a stack structure, pixel ADC 610 needs not be positioned to be on the same side as photodiode 602. Such an arrangement can increase the available area for each photodiode. As discussed above, a wearable VR/AR/MR system may include multiple image sensors to generate multiple fields of views, but the wearable system can only provide very limited areas for installing the image sensors. With a stacked structure, more pixels (and the associated photodiodes) can be included in the pixel arrays of these image sensors, which can result in substantial improvement in the resolutions of these image sensors. Moreover, the stack structure also allows each pixel cell to include a dedicated ADC (e.g., pixel ADC 610) stacked below the photodiode and without taking up additional areas. This allows each pixel cell of a pixel array to be exposed to incident lights and to generate digital representations of the incident light intensity simultaneously, which reduces the processing time for image generation, as discussed above.

Besides increasing available area for the photodiodes, the stack structure also enables minimizing routing between N-type drain 639 (the output of buffer 609) and pixel ADC 610. The minimized routing can reduce capacitive coupling and the noise charges. For example, as shown in FIG. 6B and FIG. 6C, semiconductor layers 630 and 645 can be oriented such that front surface 644 of silicon substrate 632 faces front surface 670 of silicon substrate 660. With such an arrangement, the routing distance between N-type drain 639 (configured as the capacitor) and polysilicon gate 668c (configured as input terminal of pixel ADC 610) can be reduced. In the example of FIG. 6B and FIG. 6C, N-type drain 639 and polysilicon gate 668c can be connected by straight metal 652. With the reduced routing, the noise charges can be reduced, which can reduce the minimum measurable light intensity by pixel cell 600. As a result, the dynamic range of pixel cell 600 may be extended. The reduction of routing distance and its associated parasitic capacitance also significantly reduce the power consumption, at least because the driving strength of buffer 609 can be reduced due to the reduced routing distance.

The stack structure also enables decoupling between silicon substrate 632 and silicon substrate 660, which allows the light sensing devices (e.g., photodiode 602, first switch 604) to be optimized independently from the devices of pixel ADC 610. As an example, a thickness of silicon substrate 632 (e.g., as measured between front surface 644 and back surface 646) can be set to improve the quantum efficiency of photodiode 602 in sensing photons associated with a particular frequency range. On the other hand, the thickness of silicon substrate 660 is not affected based on the target quantum efficiency. As an illustrative example, the thickness of silicon substrate 632 can be set about 4 microns. P-type layer 634 may have a thickness of approximately 3 microns, and N-type layer 636 may have a thickness of approximately 1 micron, to improve the quantum efficiency of photodiode 602 in sensing IR lights. On the other hand, the thickness of silicon substrate 660 is typically in the range of 300 microns.

Besides different thicknesses, the stack structure also enables different doping profiles to be introduced in silicon substrate 632 and silicon substrate 660 to optimize the light sensing devices and the devices of pixel ADC 610. For example, in silicon substrate 632 a doping gradient can be introduced in P-type layer 634, to create a static electric field to facilitate the movement of charges (created by the photons) into photodiode 602. With such an arrangement, more photoelectrons will be collected by the N-type drain 638, which can provide a more accurate representation of the intensity of light 651. Moreover, the doping profile of silicon substrate 632 can also be tailored to reduce the dark current (e.g., by reducing the mobility of the carriers in the substrate to reduce leakage current). On the other hand, the doping profile of silicon substrate 660 can be tailored to, for example, increase the mobility of the carriers, in order to, for example, improve the bandwidth of the devices, reduce the power consumption for pixel ADC 610, etc.

The stack structure also increase the sensor shutter efficiency, which is a measurement of the photon charge collected (ideally should be zero) due to light leakage during shutter off period. In the stack sensor embodiment, the analog voltage at the buffer output node 614 of all the pixels is quantized simultaneously by the in pixel ADC right after the shutter turned off, so the accumulated additional photon charge due to light leakage is very small. In comparison, if the ADC is shared by a column of pixels, then some pixels have to wait long time after the shutter off before being quantized. Such kind of sensor architecture requires the a charge storage diode inside the pixel to hold the signal charge, and this type of sensor tends to have lower shutter efficiency due to accumulation of leakage light for a long period of time.

Figure 7:
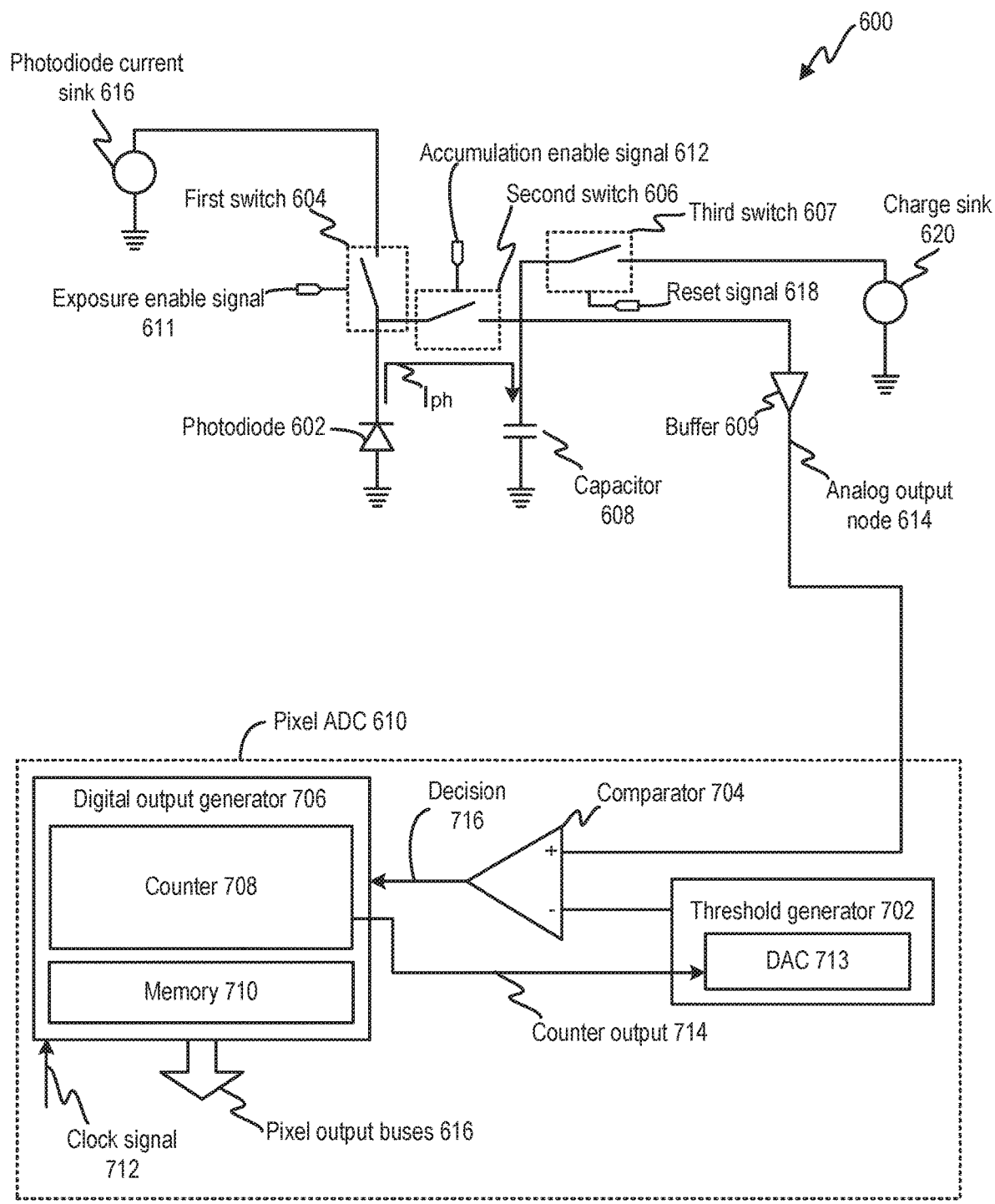
FIG. 7 is a block diagram illustrating examples of internal components of a pixel cell.

FIG. 7 illustrates an example of the internal components of pixel ADC 610. As shown in FIG. 7, pixel ADC 610 includes a threshold generator 702, a comparator 704, and a digital output generator 706. Digital output generator 706 may further include a counter 708 and a memory device 710. Counter 708 can generate a set of count values based on a free-running clock signal 712, whereas memory 710 can store at least some of the count values (e.g., the latest count value) generated by counter 708. In some embodiments, memory 710 may be part of counter 708. Memory 710 can be, for example, a latch circuit to store the counter value of based on local pixel value as described below. Threshold generator 702 includes a digital-to-analog converter (DAC)

713 which can accept a set of digital values and output an analog voltage representing the set of digital values. As to be discussed in more detail below, threshold generator 702 may accept static digital values to generate a fixed threshold, or accept output 714 of counter 708 to generate a ramping threshold.

Although FIG. 7 illustrates that DAC 713 (and threshold generator 702) is part of pixel ADC 610, it is understood that DAC 713 (and threshold generator 702) can be coupled with multiple digital output generators 706 from different pixel cells. Moreover, digital output generator 706 can also be shared among a plurality of multiple pixel cells to generate the digital values.

Comparator 704 can compare the analog voltage developed at analog output node 614 against the threshold provided by threshold generator 702, and generate a decision 716 based on the comparison result. For example, comparator 704 can generate a logical one for decision 716 if the analog voltage at analog output node 614 equals to or exceeds the threshold generated by threshold generator 702. Comparator 704 can also generate a logical zero for decision 716 if the analog voltage falls below the threshold. Decision 716 can control the counting operations of counter 708 and/or the count values stored in memory 710, to measure a property of the analog voltage at analog output node 614. The property can represent the intensity of light incident upon pixel cell 600. The stored count values in memory 710 can be transmitted by pixel output buses 616 as digital intensity values output by pixel cell 600.

A property of the analog voltage that can be measured by pixel ADC 610 is a ramping rate of the analog voltage. The ramping rate of the analog voltage can reflect an intensity of incident light. As discussed above, when the incident light intensity increases, more photons will enter pixel cell 600 within a time period. Photodiode 602 can also generate more charges during that time period because of the increase in the number of photons. Assuming that first switch 604 is enabled, more charges will be deposited in capacitor 608 within that time period. With more charges deposited in capacitor 608, the analog voltage at analog output node 614 will also ramp up faster.

Figure 8:
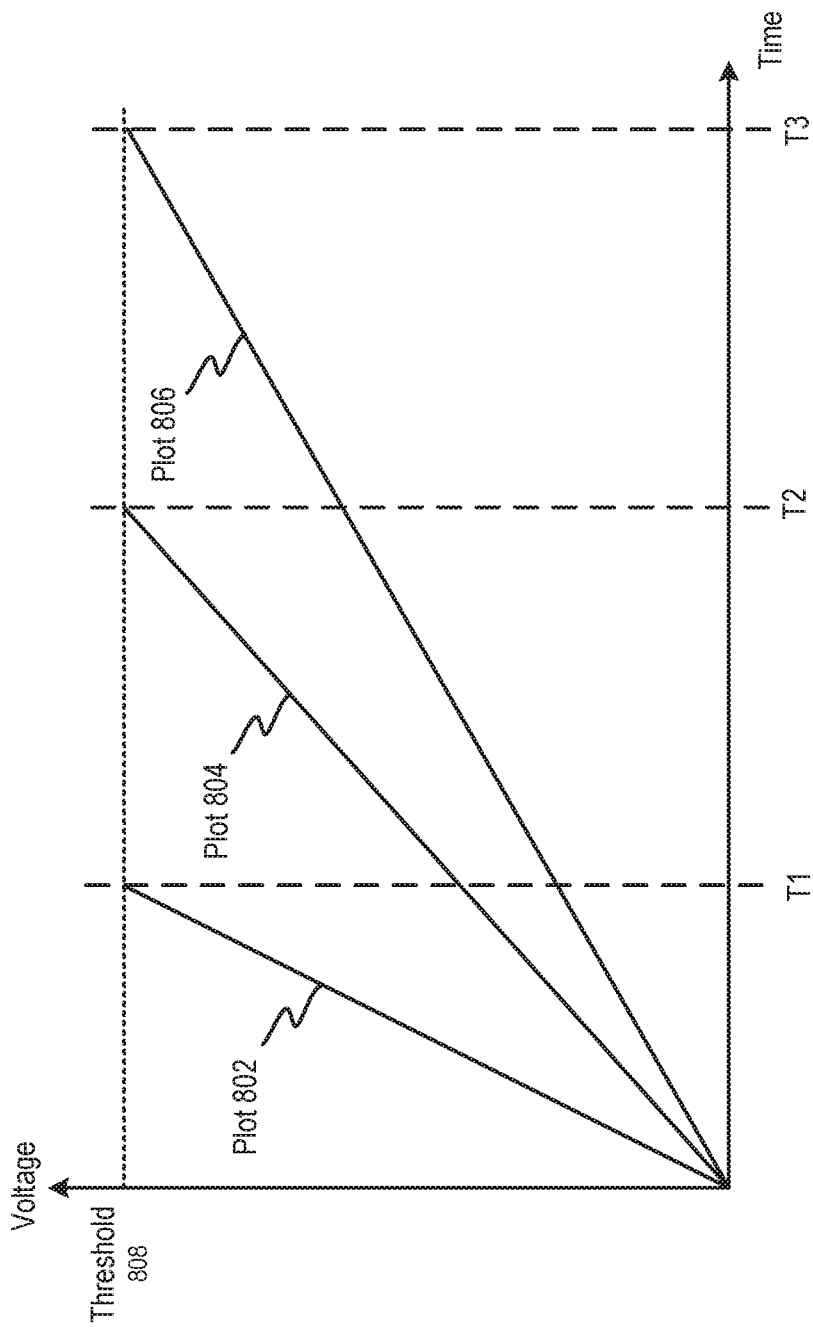
FIG. 8 illustrates example methods of determining light intensity.

FIG. 8 illustrates examples of the analog voltage change (between the initial reset voltage level and the instant voltage level at a time) at analog output node 614 for different incident light intensities. In FIG. 8, the vertical axis represents voltage, whereas the horizontal axis represents time. Plot 802 represents the change of the analog voltage at analog output node 614 with respect to time when photodiode 602 is exposed to incident light with a first intensity level. Plot 804 represents the change of the analog voltage at analog output node 614 with respect to time when photodiode 602 is exposed to incident light with a second intensity level. Further, plot 806 represents the change of the analog voltage at analog output node 614 with respect to time when photodiode 602 is exposed to incident light with a third intensity level. In the example of FIG. 8, the first intensity level is higher than the second intensity level, whereas the second intensity level is higher than the third intensity level.

The differences in the intensity levels are also reflected in the different rates of change of the analog voltages, as well as a duration for the ramping analog voltages to reach a particular threshold. For example, it takes a duration of T1 for the analog voltage represented by plot 802 to reach a threshold 808, a duration of T2 for the analog voltage represented by plot 804 to reach the same threshold 808, and a duration of T3 for the analog voltage represented by plot 806 to reach threshold 808. The durations T1, T2, and T3 can be used to represent (or estimate), respectively, the first intensity level, the second intensity level, and the third intensity level of the incident lights, with the length of duration being inversely related to the intensity level. The durations can be measured using a counter, such as counter 708 of FIG. 7.

Duration measurement can be a useful way for estimating incident light intensity when the light intensity exceeds a saturation limit of the photodiode. As discussed above, the rate of charges generated by the photodiode (e.g., the photocurrent) can be directly related to the intensity of the incident light until the photodiode reaches a saturation limit, beyond which the photocurrent may become stagnant and no longer increases linearly with the incident light intensity. Therefore, a measurement of total charges deposited by the photodiode within a fixed duration (e.g., within an exposure period) may not provide an accurate representation of the incident light intensity beyond the saturation limit. On the other hand, a direct measurement of the rate of charges generated by the photodiode, as reflected by the duration by which the ramping analog voltage reaches a threshold, may provide a more accurate representation of the incident light intensity beyond the saturation limit.

Referring back to FIG. 8, threshold 808 can be a saturation threshold voltage used for measurement of incident light intensity beyond the saturation limit. For example, the second intensity level (which plot 804 corresponds to) may be the maximum incident light intensity level for which photodiode 602 remains out of saturation, where the photocurrent of photodiode 602 remains linearly related to the incident light intensity level. Threshold 808 can be chosen to be the maximum analog voltage change at analog output node 614 at the end of the exposure period, marked by time T2.

In some embodiments, pixel ADC 610 can use threshold 808 to determine whether the incident light intensity is beyond the saturation limit, and determine a way of digitally representing the incident light intensity based on whether the saturation limit has been reached. For example, referring back to FIG. 8, the analog voltage represented by plot 802 reaches threshold 808 at time T1, which is before the end of the exposure period (T2), because the first intensity level of incident light (which causes the change of analog voltage represented by plot 802) exceeds the second intensity level of incident light (which causes the change of analog voltage represented by plot 804). On the other hand, the analog voltage represented by plot 806 reaches the threshold 808 at time T3, which is after the end of the exposure period (T2), because the third intensity level of incident light (which causes the change of analog voltage represented by plot 806) is below the second intensity level of incident light (which causes the change of analog voltage represented by plot 804).

Accordingly, pixel ADC 610 can determine whether the incident light intensity exceeds the saturation limit based on whether the ramping analog voltage at analog output node 614 reaches threshold 808 before the end of the exposure period. If the analog voltage reaches threshold 808 during the exposure period (e.g., similar to plot 802), pixel ADC 610 may determine that the incident light intensity exceeds the saturation limit. Pixel ADC 610 can use counter 708 to measure a duration for the analog voltage to reach threshold 808 to perform a time-to-saturation measurement. The count value representing the time-to-saturation measurement can be used to estimate the incident light intensity. On the other hand, if the analog voltage does not reach threshold 808 during the exposure period (e.g., similar to plot 806), pixel ADC 610 may determine that the incident light intensity does not exceed the saturation limit. In such a case, pixel ADC 610 may also measure a level of the analog voltage at the end of the exposure period, which represents the total charges generated by photodiode 602 during the exposure period, to estimate the incident light intensity.

With such arrangements, the maximum measureable light intensity for pixel cell 600 may increase beyond the saturation limit of photodiode 602, which can further increase the dynamic range of pixel cell 600. With the increased dynamic range, pixel cell 600 may be able to provide good quality image data in environments with a very wide range of light intensities.

Figure 9A:
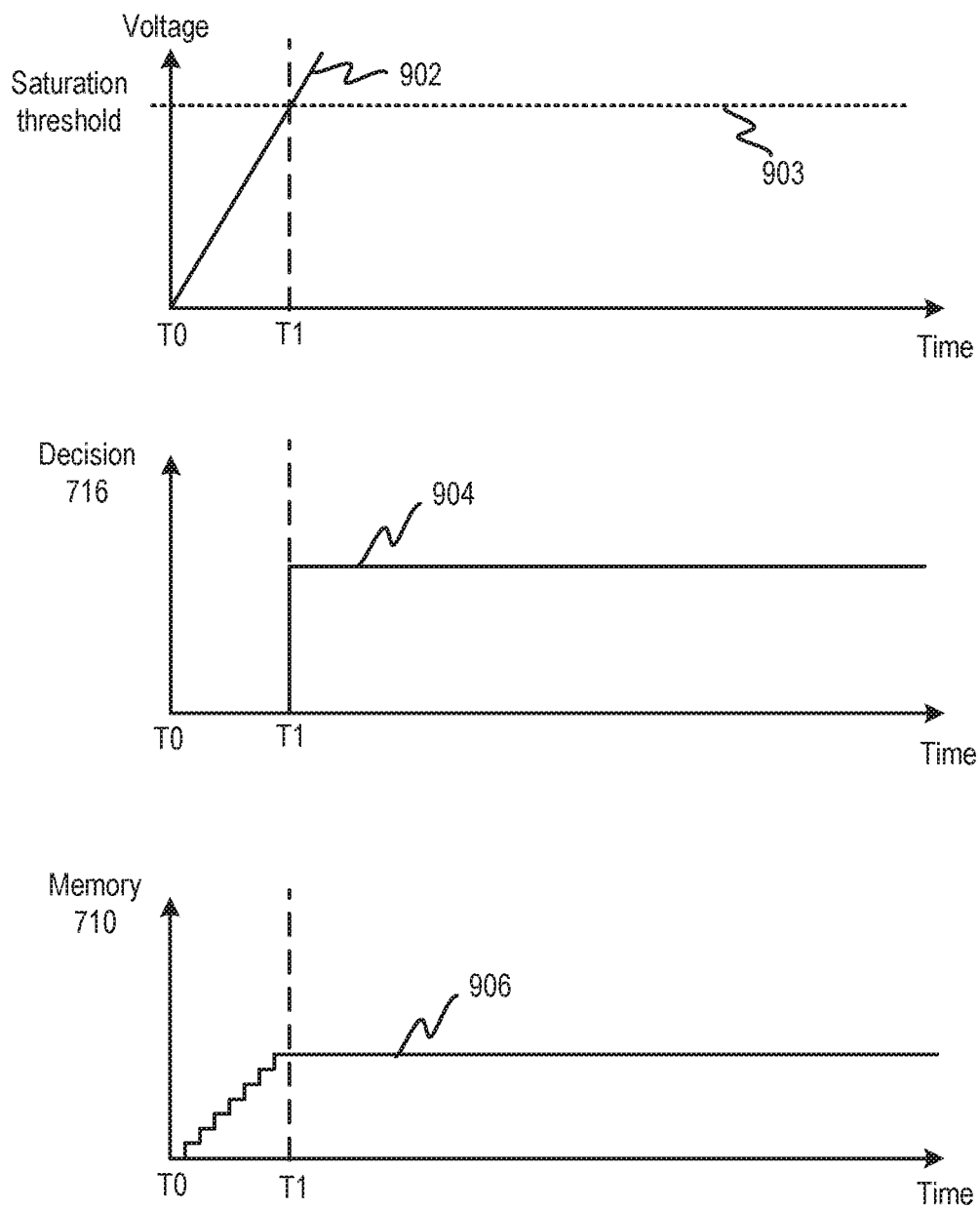
FIGS. 9A and 9B illustrate examples of operations of a pixel cell for determining light intensity.

Reference is now made to FIG. 9A, which illustrates the operation of pixel ADC 610 during the exposure period. Plot 902 represents the change of analog voltage at analog output node 614 with respect to time, while plot 903 represents the threshold output by threshold generator 702. The threshold output can be generated by DAC 713 of threshold generator 702 programmed to output a fixed threshold representing a saturation threshold voltage (e.g., threshold 808 of FIG. 8). Plot 904 represents the change in decision 716 output by comparator 704 with respect to time. Plot 906 represents the change in count value stored in memory 710 with respect to time.

At the beginning of exposure period (time T0), third switch 607 of pixel cell 600 will be enabled to reset the capacitor 608 to a known voltage, or otherwise clear charges stored in capacitor 608. For illustration purpose, in this example it is assumed that the photocurrent provided by photodiode 602 increases the charges stored in capacitor 608 (and increases the analog voltage at analog output node 614), although it is understood that the photocurrent may also reduce the charges stored in capacitor 608 (and reduce the analog voltage at analog output node 614). As shown in plot 902, the analog voltage at analog output node 614 keeps ramping up, and reaches the threshold (output by threshold generator 702) at time T1. At time T1, decision 716 by comparator 704 also flips (e.g., goes from logical one to logical zero) as the analog voltage exceeds the saturation threshold. Based on that, the flipping of decision 716 occurs during the saturation period, pixel ADC 610 may determine that the incident light intensity exceeds the saturation limit, and determine to obtain a time-to-saturation measurement to represent the intensity of the incident light. Based on this determination, pixel ADC 610 may obtain, at time T1, the latest count value of counter 708 from memory 710, and stop the counting of counter 708 (and/or freezing the count value stored in memory 710). Pixel ADC 610 can then provide the count value stored in memory 710 to represent the incident light intensity. Pixel ADC 610 may also include a signal (e.g., a flag indicator) to indicate that the count value is obtained as a time-to-saturation measurement and is inversely related to the incident light intensity.

On the other hand, if decision 716 does not flip during the exposure period, which indicates that the incident light intensity does not exceed the saturation limit, pixel ADC 610 may determine to measure the analog voltage at the end of the exposure period, which represents the total charges generated by photodiode 602 during the exposure period, to estimate the incident light intensity.

Figure 9B:
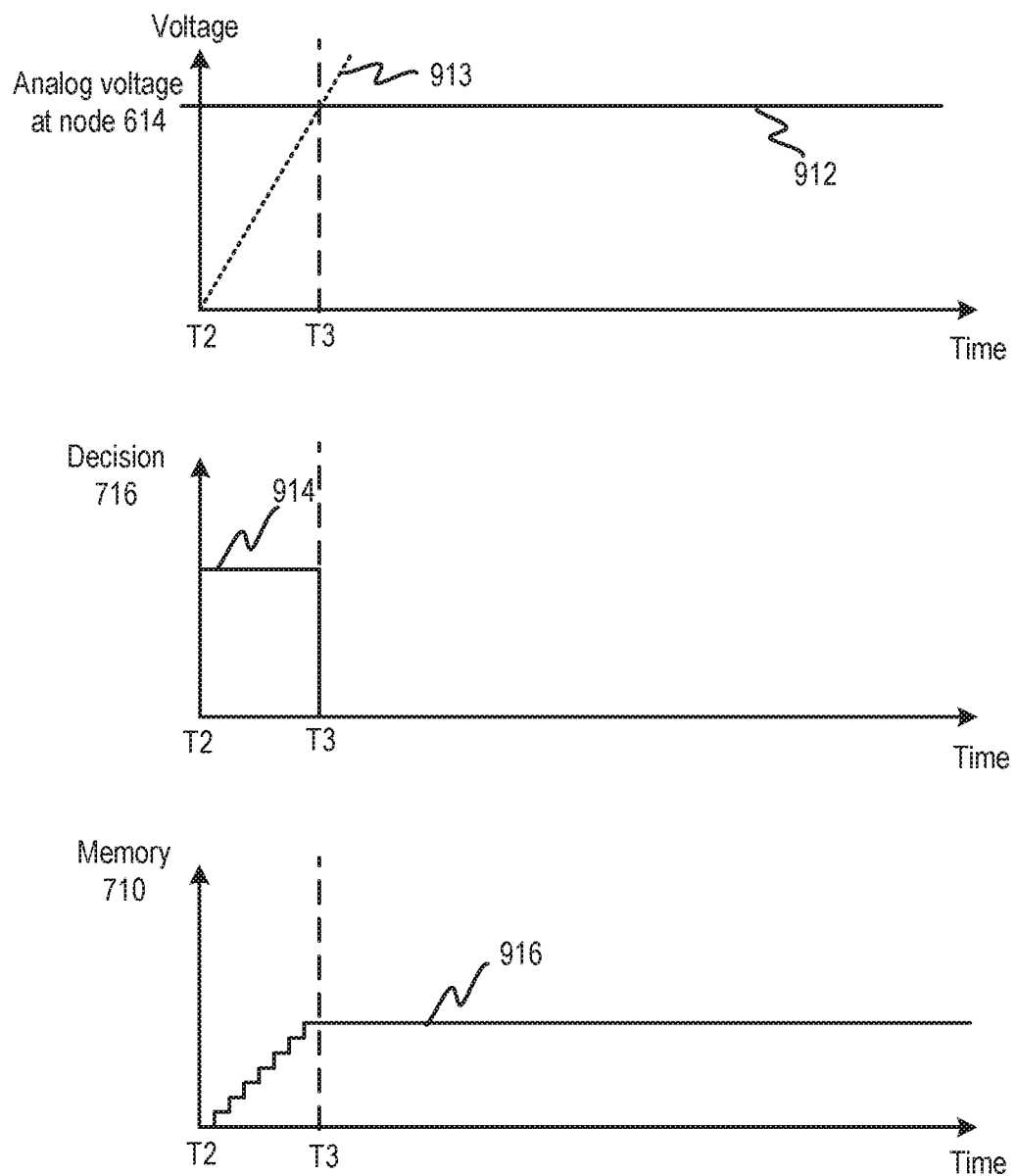

Reference is now made to FIG. 9B, which illustrates the operation of pixel ADC 610 after the exposure period ends. Plot 912 represents the analog voltage at analog output node 614. Plot 913 represents the threshold output by threshold generator 702. After the exposure period ends, threshold generator 702 may be programmed by counter output 714 to generate a voltage ramp. Plot 914 represents the change in decision 716 output by comparator 704 with respect to time. Plot 916 represents the change in count value stored in memory 710 with respect to time.

At the end of exposure period (time T2), first switch 604 of pixel cell 600 will be disabled to isolate photodiode 602 from capacitor 608. As shown in plot 912, the analog voltage remains static. At time T2, counter 708 is also enabled to generate a set of count values based on clock signal 712. The count values are output to program DAC 713 of threshold generator 702 to generate a ramping threshold, as represented by plot 913. Before the ramping threshold reaches the analog voltage, comparator 704 outputs a logical one for decision 716, as represented by plot 914. Memory 710 also stores the most updated count value generated by counter 708. At time T3, the ramping threshold reaches (or exceeds) the analog voltage. At that time point, decision 716 flips, and pixel ADC 610 can stop counter 708 from updating and/or freeze the count value stored in memory 710. Pixel ADC 610 can then provide the count value stored in memory 710 to represent the incident light intensity. Pixel ADC 610 may also include a signal (e.g., a flag indicator) to indicate that the count value is obtained as a measurement of the total charges generated by photodiode 602 during the exposure period, and is directly related to the incident light intensity.

In some embodiments, pixel ADC 610 may also perform time-to-saturation measurement at photodiode 602, which can improve the accuracy of intensity measurement due to lower dark current at photodiode 602. During the exposure period, first switch 604 may be configured as a barrier to block photocurrent generated by photodiode 602 until a voltage developed at photodiode 602 (by charge accumulation) exceeds a voltage threshold corresponding to the saturation limit. Once the voltage exceeds the threshold, photocurrent will start flowing to capacitor 608, which causes a jump in the analog voltage at analog output node 614. Pixel ADC 610 can perform the time-to saturation at photodiode 602 by measuring (e.g., using counter 708) the time elapsed between the beginning of the exposure period and the time at which the jump occurs.

Figure 10:
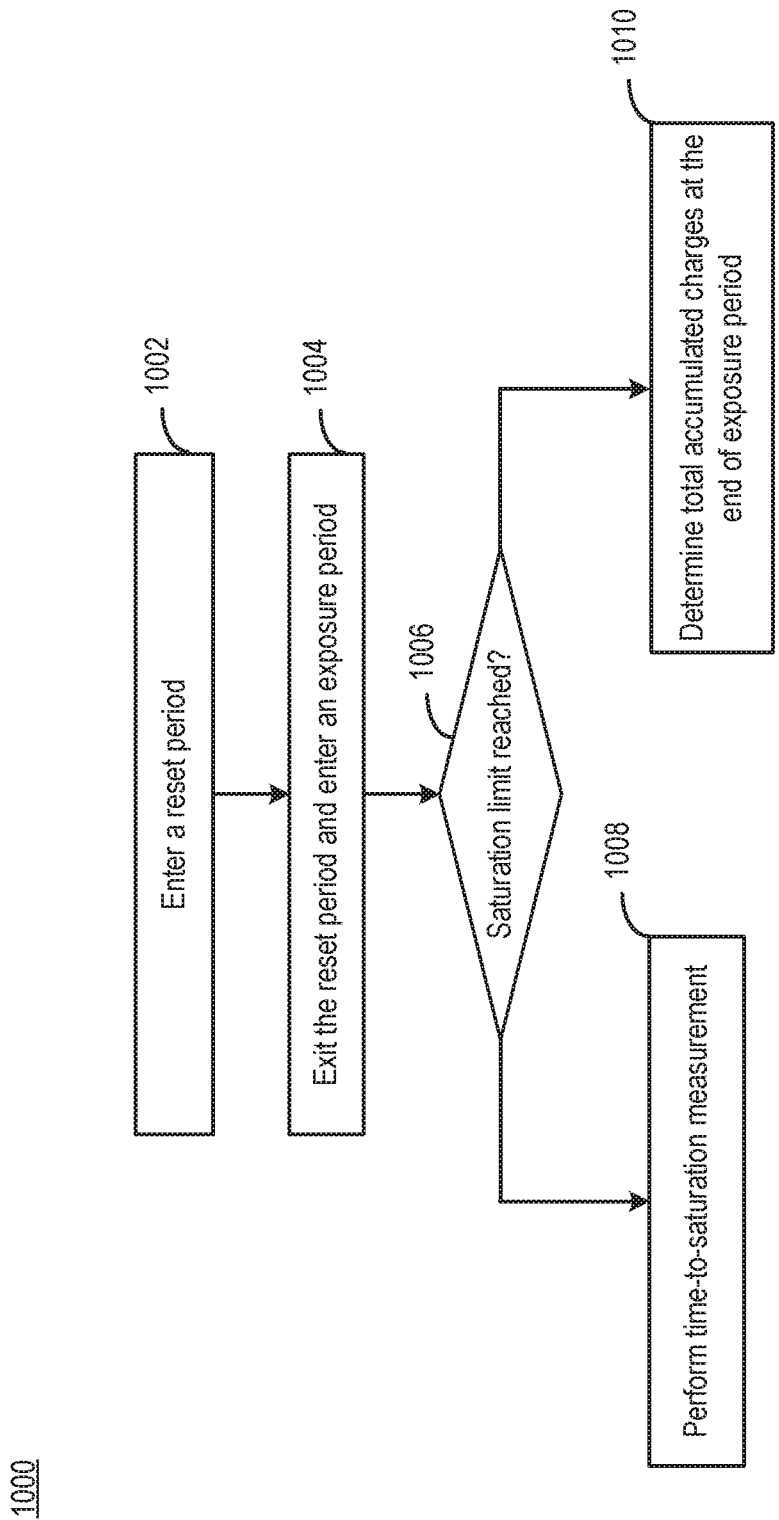
FIG. 10 illustrates an embodiment of a flowchart of a process for determining light intensity.

FIG. 10 illustrates an embodiment of a flowchart of a process 1000 for determining incident light intensity at a pixel cell (e.g., pixel cell 600). Process 1000 can be performed by a controller together with various components of pixel cell 600. Process 1000 begins in step 1002, with pixel cell 600 being operated in a reset period. Referring to the example of FIG. 6A, during the reset period of step 1002, the controller can, for example, enable first switch 604 and third switch 607, and disable second switch 606, to reset the voltage at capacitor 608 and to block photocurrent generated by photodiode 602 from reaching capacitor 608.

At step 1004, pixel cell 600 can be operated to exit the reset period and enter an exposure period. During the exposure period, the controller can disable first switch 604, enable second switch 606, and disable third switch 607, to allow photocurrent generated by photodiode 602 to reach capacitor 608 to change the quantity of charges stored in the capacitor.

At step 1006, pixel cell 600 can be operated to determine whether the intensity of the incident light reaches (or exceeds) the saturation limit during the exposure period. The determination can be based on, for example, whether the analog voltage developed at analog output node 614 (due to accumulation of additional charges at capacitor 608 from the photocurrent) reaches a saturation threshold during the exposure period. If the saturation limit is reached, pixel cell 600 can be operated to perform time-to-saturation measurement for light intensity determination, at step 1008.

On the other hand, if the saturation limit is not reached, pixel cell 600 can be operated to determine total charges accumulated at capacitor 608 at the end of the exposure period, at step 1010. At step 1010, the controller can enter a static measurement period, in which first switch 604 is enabled, while second switch 606 and third switch 607 are disabled, to preserve the charges stored at capacitor 608 for the measurement.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:

1. A pixel cell comprising:
   a photodiode;
   a capacitor configured to store, at least, a portion of charge generated by the photodiode in response to incident light as a first charge; and
   a processing circuit configured to:
      perform at least one of a first mode of measurement to generate a first output or a second mode of measurement to generate a second output; and
      provide, based on an intensity range of the incident light, one of the first output or the second output to represent an intensity of the incident light,
   wherein in the first mode of measurement, the processing circuit is configured to determine, when the capacitor is electrically coupled with the photodiode, a time when a quantity of the first charge stored at the capacitor exceeds a threshold to generate the first output; and
   wherein in the second mode of measurement, the processing circuit is configured to measure the quantity of the first charge stored at the capacitor when the capacitor is electrically isolated from the photodiode to generate the second output.

2. The pixel cell of claim 1, wherein the processing circuit comprises a comparator; and
   wherein the processing circuit is coupled with a variable threshold generator and a counter.

3. The pixel cell of claim 2, wherein, in the first mode of measurement:
   the variable threshold generator is configured to generate a fixed threshold voltage;
   the comparator is configured to compare the fixed threshold voltage against a voltage representing the quantity of the first charge stored at the capacitor to generate a decision output;
   the counter is configured to generate a set of count values; and
   a first count value of the set of count values generated by the counter when the decision output indicates that the voltage intersects with the fixed threshold voltage measures the time when the quantity of the first charge stored at the capacitor exceeds the threshold; and
   the first count value is generated as the first output.

4. The pixel cell of claim 3, wherein the first count value decreases when the intensity of incident light increases.

5. The pixel cell of claim 3, wherein the fixed threshold voltage corresponds to a saturation light intensity for the capacitor.

6. The pixel cell of claim 2, wherein, in the second mode of measurement:
   the variable threshold generator is configured to generate a ramping voltage;
   the comparator is configured to compare the ramping voltage against a voltage representing a quantity of the first charge stored at the capacitor to generate a decision output;
   the counter is configured to generate a set of count values and a second count value of the set of count values generated by the counter when the decision output indicates that the voltage intersects with the ramping voltage measures the quantity of the first charge stored at the capacitor; and
   the second count value is generated as the second output.

7. The pixel cell of claim 6, wherein the second count value increases when the intensity of incident light increases.

8. The pixel cell of claim 1, wherein the processing circuit is configured to skip the second mode of measurement based on a determination, from the first mode of measurement, that the quantity of the first charge stored at the capacitor when the photodiode is electrically coupled with the photodiode exceeds the threshold.

9. The pixel cell of claim 1, wherein the processing circuit is configured to:
   start an exposure period in which the capacitor receives and stores the at least a portion of the charge generated by the photodiode as the first charge;
   during the exposure period, perform the first mode of measurement to determine whether a quantity of the first charge reaches the threshold and, if the quantity of the first charge reaches the threshold, determine the time when the quantity of the first charge stored at the capacitor reaches the threshold as the first output;
   after the exposure period ends:
      electrically isolate the capacitor from the photodiode; and
      perform the second mode of measurement to measure the quantity of the first charge stored at the capacitor when the exposure period ends as the second output.

10. The pixel cell of claim 9, wherein the processing circuit is configured to:
   output the one of the first output or the second output based on whether the quantity of the first charge stored at the capacitor reaches the threshold during the exposure period.

11. The pixel cell of claim 1, wherein the photodiode and the capacitor is included in a first semiconductor substrate; and
   wherein the processing circuit is included in a second semiconductor substrate; and
   wherein the first semiconductor substrate and the second semiconductor substrate form a stack structure.

12. The pixel cell of claim 11, wherein the capacitor is formed as a floating drain region in the first semiconductor substrate; and
   wherein the pixel cell further comprises a straight interconnect that connects between the floating drain region and the processing circuit, the straight interconnect traversing the first semiconductor substrate and the second semiconductor substrate.

13. The pixel cell of claim 6, wherein, in the second mode of measurement:
   the variable threshold generator is configured to generate the ramping voltage based on the set of count values generated by the counter.

* * * * *